United States Patent [19]

Matsuyama

[11] Patent Number: 5,771,315
[45] Date of Patent: Jun. 23, 1998

[54] IMAGE READING APPARATUS AND IMAGE PROCESSOR INCORPORATING THE SAME FOR COMPARING READ PATTERNS CORRESPONDING TO VISIBLE AND INFRARED LIGHT WITH REGISTERED PATTERNS TO IDENTIFY COPY-PROHIBITED PRINTED MATTER

[75] Inventor: Kazuhiro Matsuyama, Ikoma, Japan

[73] Assignee: Sharp Kabushiki Kaisha, Osaka, Japan

[21] Appl. No.: 259,958

[22] Filed: Jun. 14, 1994

[30] Foreign Application Priority Data

Jun. 15, 1993 [JP] Japan .................................. 5-143680
Jun. 16, 1993 [JP] Japan .................................. 5-145246

[51] Int. Cl.⁶ .............................. G06K 9/46; G03G 21/04
[52] U.S. Cl. ........................ 382/191; 382/195; 382/199; 382/135; 355/366
[58] Field of Search .............................. 355/201; 380/18, 380/54; 382/135, 165, 191, 195, 199; 399/15, 366; 283/902

[56] References Cited

U.S. PATENT DOCUMENTS

| | | | |
|---|---|---|---|
| 4,464,786 | 8/1984 | Nishito et al. | 382/135 |
| 4,739,377 | 4/1988 | Allen . | |
| 5,208,630 | 5/1993 | Goodbrand et al. | 399/15 |
| 5,351,303 | 9/1994 | Willmore | 382/115 |
| 5,424,807 | 6/1995 | Ohmura | 399/366 |
| 5,426,710 | 6/1995 | Suzuki et al. | 382/135 |
| 5,602,939 | 2/1997 | Hashiguchi et al. | 382/162 |

FOREIGN PATENT DOCUMENTS

| | | |
|---|---|---|
| 0 342 060 A3 | 11/1989 | European Pat. Off. . |
| 0 493 961 | 7/1992 | European Pat. Off. . |
| 0 529 744 | 3/1993 | European Pat. Off. . |
| 0 599 218 | 6/1994 | European Pat. Off. . |
| 0 607 706 | 7/1994 | European Pat. Off. . |
| 2-55378 | 2/1990 | Japan . |
| 2-74977 | 3/1990 | Japan . |
| 4-227365 | 8/1992 | Japan . |
| 4-227372 | 8/1992 | Japan . |
| 6-70153 | 3/1994 | Japan . |
| 2 155 860 | 10/1985 | United Kingdom . |

*Primary Examiner*—Scott Rogers
*Attorney, Agent, or Firm*—David G. Conlin; David D. Lowry

[57] ABSTRACT

An image reading apparatus includes a first reading element for receiving visible light in reflected light from a color document and reading image data corresponding to the visible light as electric signals, and a second reading element for receiving infrared light in reflected light from the color document and reading image data corresponding to the infrared light as electric signals. The image reading apparatus thus reads the image data not only from the visible light but also from the infrared light. Consequently, the image reading apparatus is capable of reading a special distinguishing pattern of copy-prohibited printed matter printed with special ink, such as infrared absorbing ink, as well as ordinary image data, and thereby preventing counterfeiting of copy-prohibited printed matter.

11 Claims, 25 Drawing Sheets

SPECTRAL TRANSMISSION CHARACTERISTIC

SPECTRAL TRANSMISSION CHARACTERISTIC

W, X, Y, Z ⋯ QUANTIZED VALUE
t1, t2, t3 ⋯ THRESHOLD VALUE

→ MAIN SCANNING DIRECTION

FIG. 23

| |
|---|
| H.5.1.25    10:15<br>PATTERN ② ··· FIRST TIME |
| H.5.1.27    20:25<br>PATTERN ① ··· FIRST TIME |
| H.5.2.10    18:10<br>PATTERN ① ··· SECOND TIME |
| ⋮<br>⋮ |

5,771,315

IMAGE READING APPARATUS AND IMAGE PROCESSOR INCORPORATING THE SAME FOR COMPARING READ PATTERNS CORRESPONDING TO VISIBLE AND INFRARED LIGHT WITH REGISTERED PATTERNS TO IDENTIFY COPY-PROHIBITED PRINTED MATTER

FIELD OF THE INVENTION

The present invention relates to an image reading apparatus for reading an image on a color document by converting image data of the color document into electric signals, and to an image processor such as a digital full-color copying machine and a full-color scanner incorporating the image reading apparatus.

BACKGROUND OF THE INVENTION

Some of conventional image reading apparatuses, which are incorporated into an image processor such as a copying machine and read an image on a document by converting the image data of the document into electric signals, are capable of reading an image on a color document. As illustrated in FIG. 25, such an image reading apparatus includes a document platen 171 on which a color document M is placed, a lamp unit 172 for applying light to the color document M on the document platen 171, mirrors 173, an infrared-light cut-off filter 174, an imaging lens 175, and a reading element 176 for reading a color document. When reflected light from the color document M falls onto the reading element 176 through the mirrors 173, the infrared-light cut-off filter 174 and the imaging lens 175, the image data of the color document M is converted into electric signals and an image on the color document M is read.

The reflected light from the color document M is composed of visible light and infrared light. The infrared light is cut off by the infrared-light cut-off filter 174. Consequently, as shown in FIG. 26, only the visible light including blue light B, green light G and red light R falls onto the reading element 176.

The reading element 176 has three lines of light receiving sections 180, 181 and 182 including filter members 177, 178 and 179, respectively. Each of the filter members 177, 178 and 179 selectively transmits blue light B, green light G or red light R. The reading element 176 reads the image data of the color document M by converting the visible light (the blue light B, green light G and red light R) from the color document M into electric signals.

Each of the filter members 177, 178 and 179 has the spectral transmission characteristic shown in FIG. 5 and transmits infrared light at a wavelength not lower than 700 nm. FIG. 5 will also be referred to when EMBODIMENT 1 of the present invention is explained. The light receiving sections 180, 181 and 182 are sensitive not only to visible light but also to infrared light.

Thus, in an image reading apparatus capable of reading a color document, the infrared-light cut-off filter 174 is disposed in front of the imaging lens 175 as described above or an infrared-light cut-off film, not shown, is deposited on the imaging lens 175 so as to accurately read the image on the-color document M from the visible light from the color document M. As disclosed in Japanese Publication for Unexamined Patent Application No. 55378/1990, such an image reading apparatus prevents counterfeiting of copy-prohibited printed matter such as paper money and securities by incorporating an input/output judgement device for judging whether a document read is a specified document.

The conventional image reading apparatus reads the image data simply from the visible light from the color document M. Therefore, whether the color document M read is copy-prohibited printed matter or not is merely judged by checking the pattern of the visible light.

However, if copy-prohibited printed matter is printed using special ink such as an infrared-light absorbing ink in future, the above-mentioned apparatus can not read a special distinguishing pattern thereof. Since the ability of distinguishing copy-prohibited printed matter is low, the conventional apparatus is likely to make misjudgment, for example, judges that copy-prohibited printed matter as ordinary printed matter or ordinary printed matter as copy-prohibited printed matter. Consequently, counterfeiting of copy-prohibited printed matter may not be prevented, and making copies of ordinary printed matter may be prevented, causing a user trouble.

An image processor incorporating the above-mentioned conventional image reading apparatus has a dictionary circuit (input/output judgement device). The dictionary circuit performs a learning function for judging whether a color document M is copy-prohibited printed matter or not, and has an image memory. Considering the memory capacity, judgment processing time and costs, the image memory stores only some specified copy-prohibited printed matter.

For example, Japanese Publication for Unexamined Patent Application No. 227365/1992 proposes a copying machine including judging means for judging whether an input image is identical to a specific image stored in the image memory, processing means for reproducing the input image, and controlling means for controlling the reproduction of the input image performed by the processing means according to an output from the judging means. This structure prevents counterfeiting of copy-prohibited printed matter.

As the function of the image processor, for example, a color copying machine is improved, the possibility of counterfeiting copy-prohibited printed matter using such an apparatus increases. In order to prevent such a crime, a color copying machine incorporates an examining device. If copy-prohibited printed matter is placed as a document on the color copying machine, the machine stops performing copying, or outputs an image different from the image of the copy-prohibited printed matter.

Next, half-tone image processing performed by the conventional image processor is explained with reference to FIGS. 27 and 28. The half-tone image processing reduces the number of tones in one pixel during printing (copying) by decreasing the volume of digital image data per pixel. With this processing, the capacity of memory occupied by the image data is reduced, and the image is printed with a printer having a quite low tonal range.

The processes in the half-tone image processing are as follows. First, a data input section in the image processor reads the image data by reading 0 to 255 tones (i.e., a density level) of a pixel. Second, a central processing unit (CPU) in the image processor quantizes the read image data as illustrated in FIG. 15 which will be referred to when EMBODIMENT 3 of the present invention is explained. More specifically, the CPU quantizes the image data into four quantized values W (density level 255), X (density level 170), Y (density level 85) and Z (density level 0) according to the relation in level among, for example, three threshold values t1, t2 and t3, where t1>t2>t3.

Denoting the density level of the image data as f, for example, the CPU sets the density level of the image data as follows. When $255 \geq f > t1$, the quantized value W is taken as the density level. When $t1 \geq f > t2$, the quantized value X is taken as the density level. When $t2 \geq f > t3$, the quantized value Y is taken as the density level. When $t3 \geq f \geq 0$, the quantized value Z is taken as the density level. The threshold values t1, t2 and t3, and the quantized values W, X, Y and Z are predetermined with respect to the density level ranging from 0 to 255.

Since the density of the original image data is not kept only by quantization, the smoothness of the image quality is not maintained. In order to smooth the image quality, the CPU obtains an error $\epsilon$ which is the difference in density between the quantized image data and the original image data, and performs density processing on pixels around a target pixel so as to keep the density of the original image data.

Namely, the CPU processes the quantized image data through the steps shown by the flowchart of FIG. 28.

First, as illustrated in FIG. 27, the error $\epsilon$ is allocated by a predetermined allocating ratio for four pixels: pixel D located on the lower-left side of the target pixel B on the i line; pixel E just below the target pixel B; pixel F located on the lower-right side of the target pixel B; and pixel C on the right side of the target pixel B (step 81). The pixels D, E and F are located on the (i+1) line next to the i line having the target pixel B. Second, whether the all the image data has been processed or not is judged (step 82), and the operation is complete if so. If not, i is judged to be i+1 (step 83), steps 81 and 82 are repeated until all the image data is processed.

However, with the conventional image processing apparatus, it is necessary to replace the dictionary circuit, for example, every time the pattern of the copy-prohibited printed matter is updated or new copy-prohibited printed matter is registered. Namely, the conventional image processing apparatus requires time-consuming replacement of the dictionary circuit.

SUMMARY OF THE INVENTION

It is an object of the present invention to provide an image reading apparatus capable of reading copy-prohibited printed matter printed with special ink such as infrared-light absorbing ink and preventing counterfeiting of copy-prohibited printed matter.

It is another object of the present invention to provide an image processor capable of easily registering or updating copy-prohibited printed matter by reading the copy-prohibited printed matter and storing the read image data in storage means.

In order to achieve the above object, an image reading apparatus of the present invention includes first photoelectric converting means for receiving visible light in reflected light from a color document and reading image data corresponding to the visible light as electric signals; and second photoelectric converting means for receiving infrared light in the reflected light and reading image data corresponding to the infrared light as electric signals.

This structure permits the image reading apparatus to read the image data not only from visible light, but also from infrared light from which a conventional apparatus can not read the image. Namely, the image reading apparatus is capable of reading not only ordinary image data, but also a special distinguishing pattern of copy-prohibited printed matter printed using special ink such as infrared-light absorbing ink. Thus, the image reading apparatus prevents counterfeiting of copy-prohibited printed matter.

In order to achieve another object, an image processor of the present invention includes an image reading apparatus for receiving reflected light from copy-prohibited printed matter and reading image data corresponding to the reflected light as electric signals, recognizing means for recognizing a distinguishing portion of the copy-prohibited printed matter from the image data read by the image reading apparatus, and storage means for storing the recognized distinguishing portion.

This structure allows the image processor to easily register or update the distinguishing portion of the image data of the copy-prohibited printed matter. Thus, the image processor prevents counterfeiting of copy-prohibited printed matter.

For a fuller understanding of the nature and advantages of the invention, reference should be made to the ensuing detailed description taken in conjunction with the accompanying drawings.

BRIEF DESCRIPTION OF THE DRAWINGS

FIG. 23 is a view explaining the content of memory in an image processor incorporating an image reading apparatus according to still another embodiment of the present invention.

EMBODIMENT OF PREFERRED EMBODIMENTS

EMBODIMENT 1

The following description discusses one embodiment of the present invention with reference to FIGS. 1 to 5.

Figure 1:
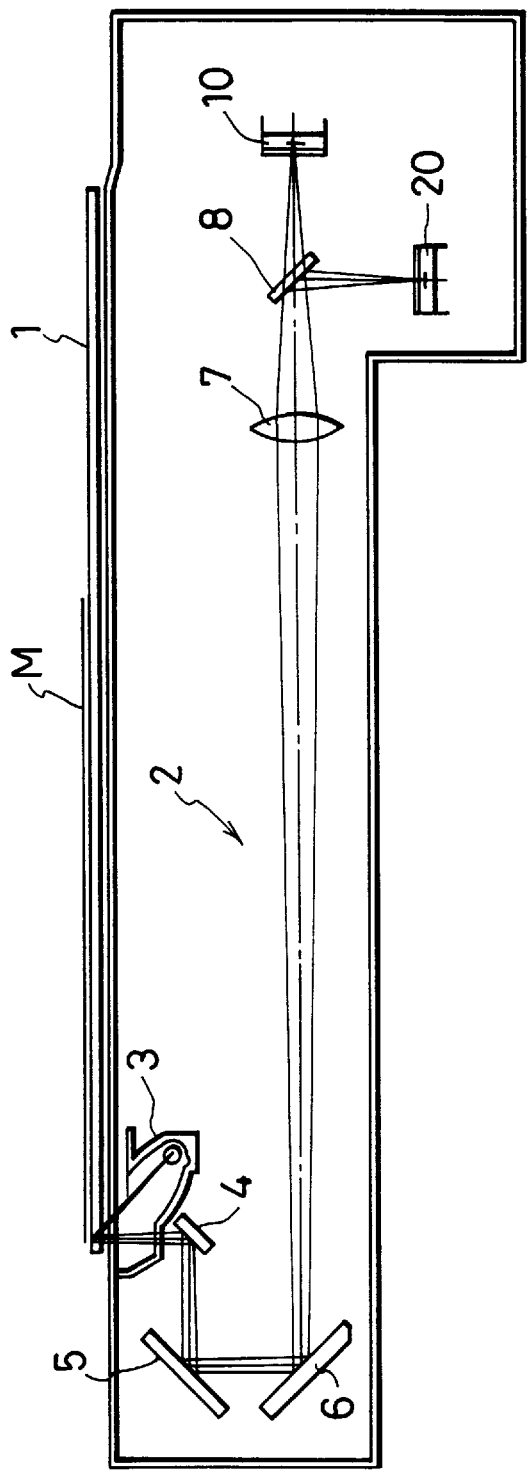
FIG. 1 is a view showing a schematic structure of an image reading apparatus according to one embodiment of the present invention.

As illustrated in FIG. 1, an image reading apparatus of this embodiment incorporates a document platen 1 made from rigid glass at the top, an exposure optical system 2, and first and second reading elements 10 and 20 formed by CCDs (charge coupled devices). The exposure optical system 2, and the first and second reading elements 10 and 20 are disposed under the document platen 1.

The exposure optical system 2 includes a lamp unit 3, mirrors 4, 5 and 6, an imaging lens 7, and an infrared-light reflecting mirror (reflected-light separating means) 8. The lamp unit 3 has a halogen lamp which scans a color document M placed on the document platen 1 by applying light thereto. The mirrors 4, 5 and 6 guide reflected light (visible light and infrared light) from the color document M along a predetermined light path. The imaging lens 7 causes the reflected light guided by the mirrors 4, 5 and 6 to fall onto the first and second reading elements 10 and 20. The infrared-light reflecting mirror 8 is disposed at a redetermined angle between the imaging lens 7 and the first reading element 10. The first reading element 10 is located at the converging point of the imaging lens 7.

Figure 2:
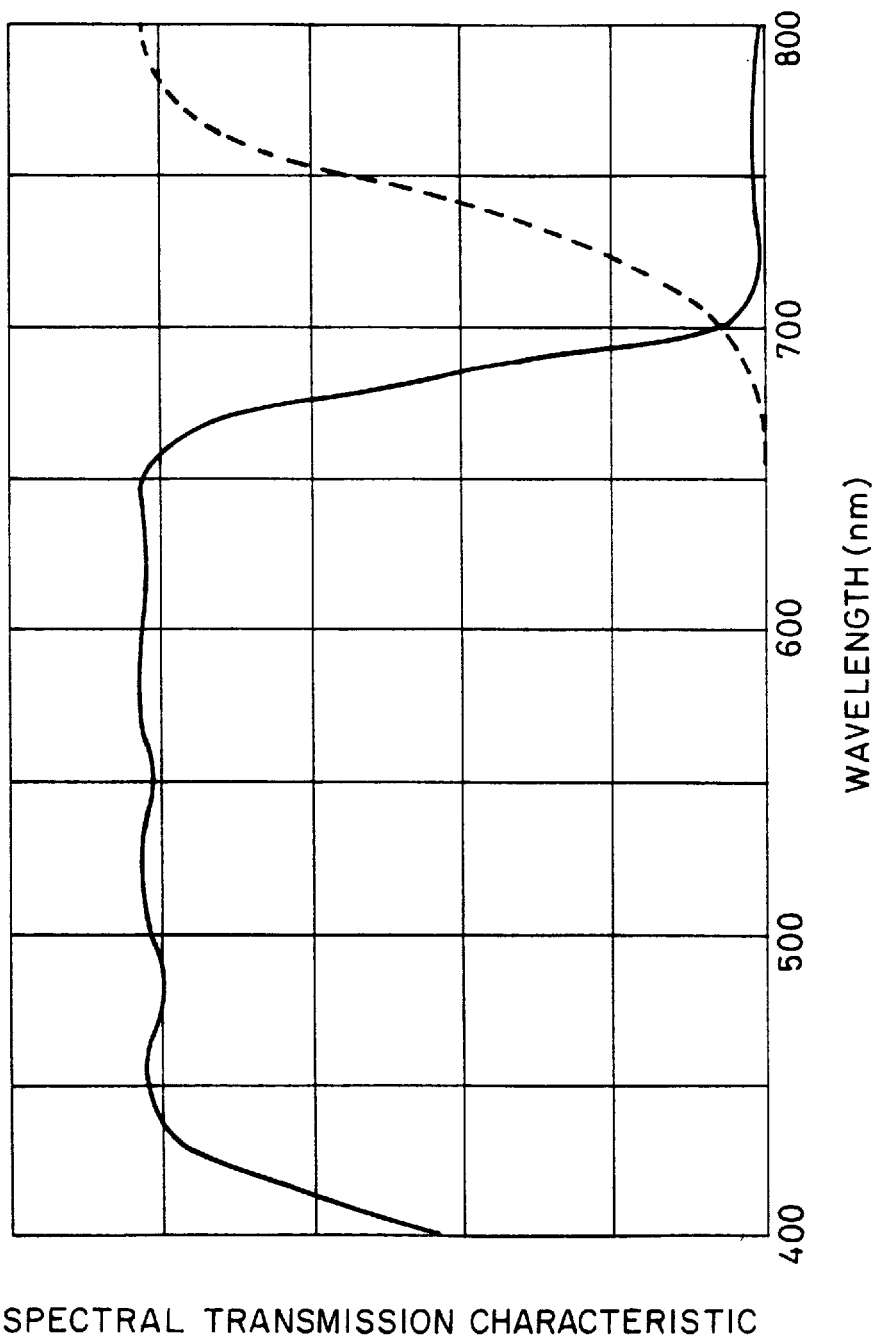
FIG. 2 is a graph showing the spectral transmission characteristic of an infrared-light reflecting mirror in the image reading apparatus.
Figure 3:
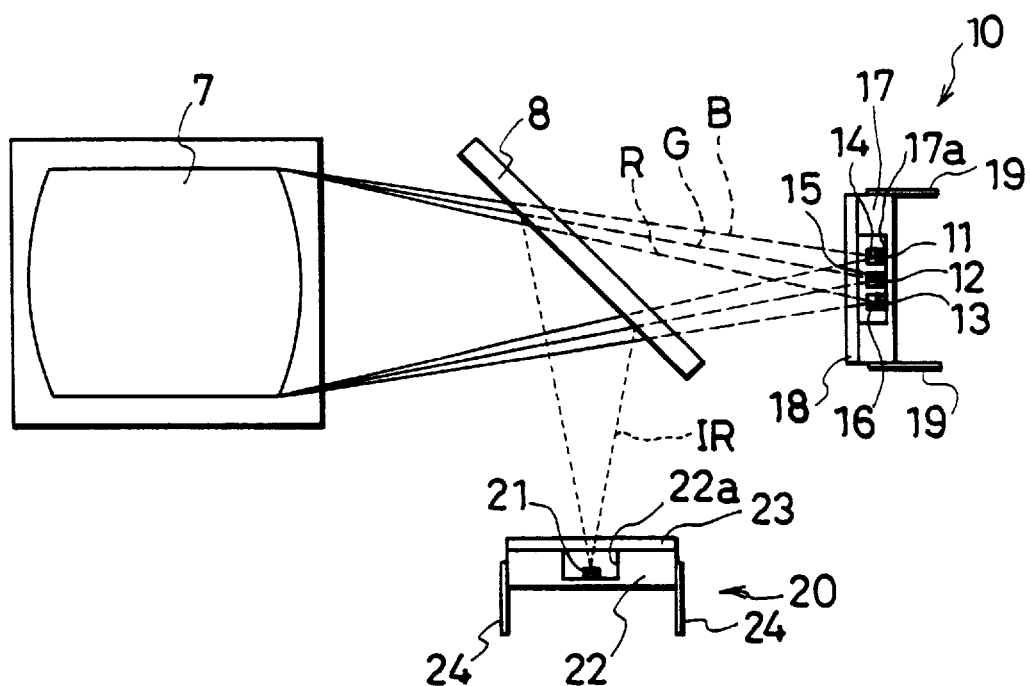
FIG. 3 is a vertical section of the image reading apparatus where a first reading element is exposed to visible light and a second reading element is exposed to infrared light.

The infrared-light reflecting mirror 8 usually has the spectral transmission characteristic (opposite to spectral reflection characteristic) shown by the solid line in FIG. 2. As illustrated in FIG. 3, the infrared-light reflecting mirror 8 transmits visible light (indicated by the broken lines) in the reflected light from the imaging lens 7, and causes the visible light to fall onto the first reading element 10. The visible light includes blue light B, green light G and red light R. Meanwhile, the infrared-light reflecting mirror 8 reflects infrared light IR (indicated by the dot lines) in the reflected light from the imaging lens 7, and causes the infrared light IR to fall onto the second reading element 20.

The first reading element 10 (first photoelectric converting means) includes three lines (blue, green and red) of light receiving sections 11, 12 and 13, blue, green and red filter members 14, 15 and 16, a base member 17, cover glass 18, and a plurality of pin terminals 19. The filters 14, 15 and 16 are disposed to face the light receiving sections 11, 12 and 13, respectively. The base member 17 holds these members 11 to 16 in an indented section 17a. The cover glass 18 closes the indented section 17a. The pin terminals 19 electrically connect the first reading element 10 to an input/output judgement device 30, to be described later.

Figure 5:
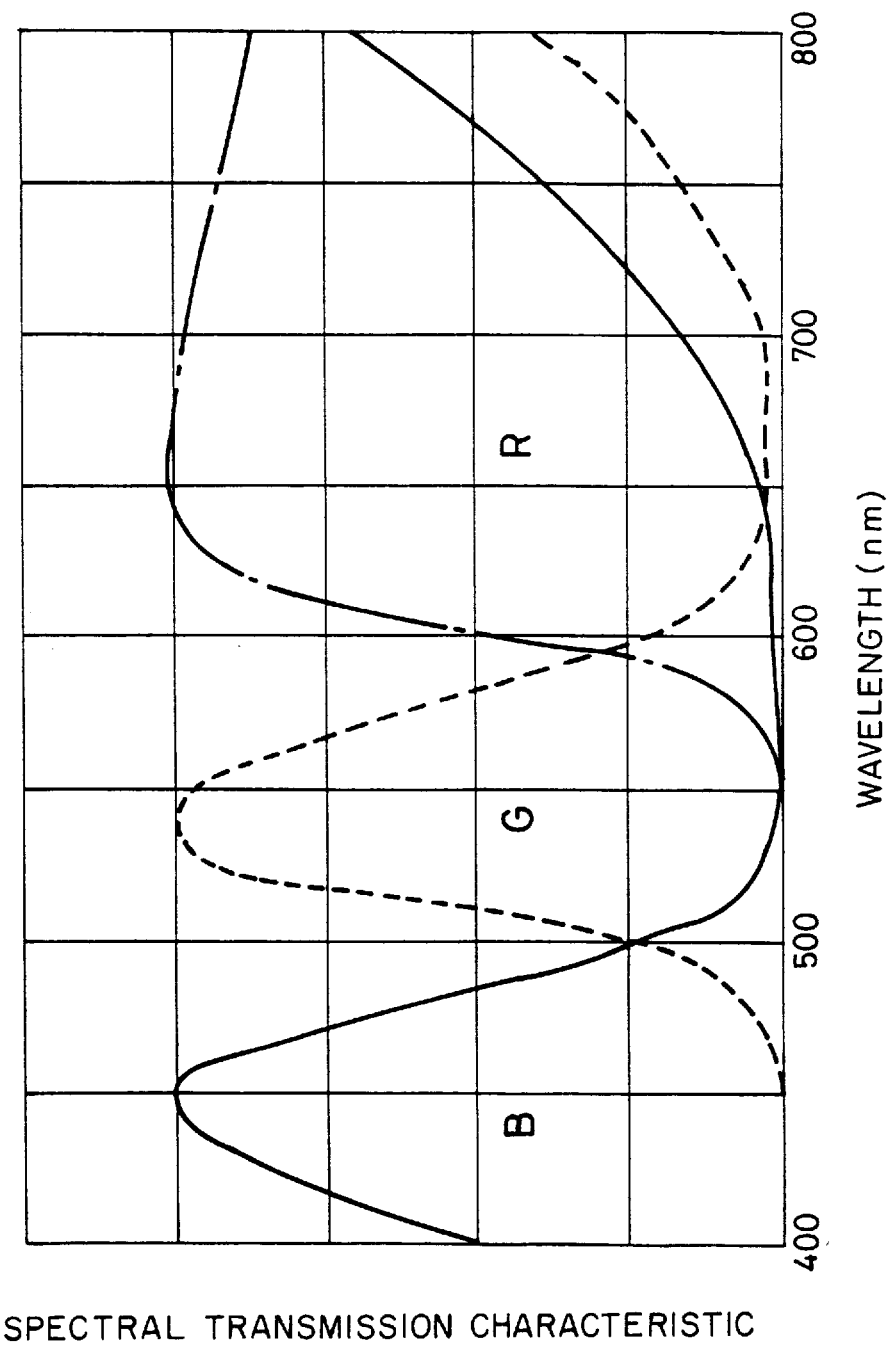
FIG. 5 is a graph showing the spectral transmission characteristic of a filter member in the first reading element.

The filter member 14 selectively transmits the blue light B of the visible light, and usually has the spectral transmission characteristic shown by the solid line in FIG. 5. The filter member 15 selectively transmits the green light G of the visible light, and usually has the spectral transmission characteristic shown by the broken line in FIG. 5. The filter member 16 selectively transmits the red light R of the visible light, and usually has the spectral transmission characteristic shown by the alternate long and short dash line in FIG. 5.

The light receiving section 11 receives the blue light B transmitted through the filter member 14, and converts it to electric signals so as to obtain image data corresponding to the blue light B from the color document M. The light receiving section 12 receives the green light G transmitted through the filter member 15, and converts it to electric signals so as to obtain image data corresponding to the green light G from the color document M. The light receiving section 13 receives the red light R transmitted through the filter member 16, and converts it to electric signals so as to obtain image data corresponding to the red light R from the color document M. Several thousands light receiving sections 11, 12 and 13 are respectively aligned in a direction perpendicular to the paper surface of FIG. 3.

The second reading element 20 (second photoelectric converting means) includes infrared-light receiving sections 21, a base member 22, cover glass 23, and a plurality of pin terminals 24. Several thousands infrared-light receiving sections 21 are arranged in one line. The base member 22 holds the infrared-light receiving sections 21 in an indented section 22a. The cover glass 23 closes the indented section 22a. The pin terminals 24 are electrically connected to the input/output judgement device 30, to be described later. The infrared-light receiving section 21 receives infrared light IR reflected by the infrared-light reflecting mirror 8, and converts it to electric signals so as to obtain image data corresponding to the infrared light IR from the color document M.

Figure 4:
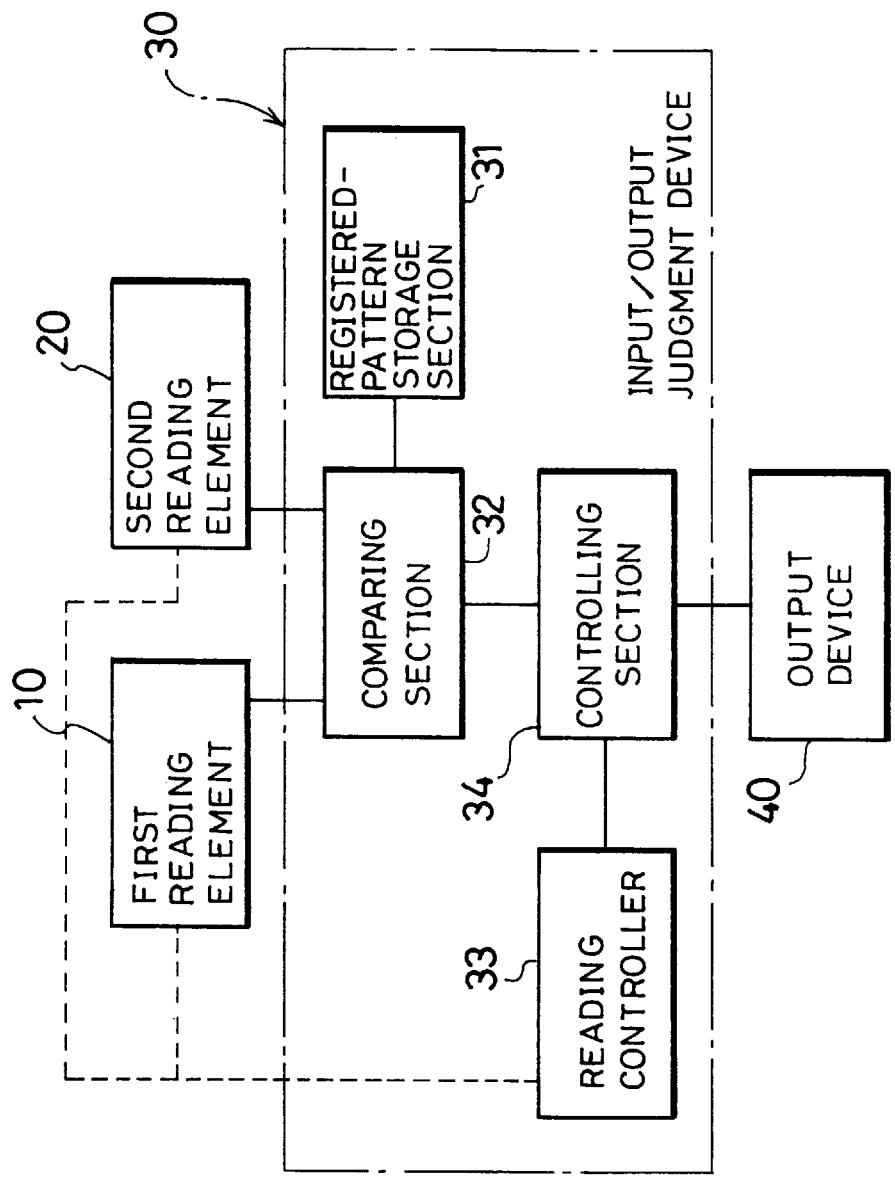
FIG. 4 is a block diagram of an input/output judgement device in the image reading apparatus.

As illustrated in FIG. 4, the image reading apparatus of this embodiment incorporates the input/output judgement device 30, and an output device 40. The input/output judgement device 30 prevents counterfeiting of copy-prohibited printed matter such as paper money and securities. The output device 40 outputs the image data of the read color document M to an image processor, not shown, having a photoreceptor.

The input/output judgement device 30 has a registered-pattern storage section (registered-pattern storage means) 31, a comparing section (comparing means) 32, a reading controller 33, and controlling section (controlling means) 34. The registered-pattern storage section 31 includes a RAM, and stores image data corresponding to visible light (blue light B, green light G and red light R) and infrared light IR from several kinds of copy-prohibited printed matter as registered patterns in advance. The comparing section 32 compares image data corresponding to the visible light and the infrared light IR from an arbitrary color document M transmitted from the first and second reading elements 10 and 20 with the respective registered patterns of the visible light and the infrared light IR stored in the registered-pattern storage section 31. The reading controller 33 controls the operations of the first and second reading elements 10 and 20 for reading the image data. The controlling section 34 is connected to the output device 40. The controlling section 34 controls the comparing means 32, the reading controller 33, and the output device 40.

The comparing section 32 is electrically connected to the first and second reading elements 10 and 20 through the pin terminals 19 and 24.

When the comparing section 32 judges that the image data of an arbitrary color document M obtained by the visible light and the infrared light IR does not correspond to the registered patterns of the visible light and the infrared light IR, the input/output judgement device 30 judges that the color document M is not copy-prohibited printed matter. Then, the controlling section 34 controls the reading controller 33 to cause the first and second reading elements 10 and 20 to continue to read the image data, and the read image data is sent to the output device 40.

On the other hand, when the comparing section 32 judges that at least image data obtained by the visible light or the infrared light IR from an arbitrary color document M perfectly corresponds to the registered pattern, the input/output judgement device 30 judges that the color document M is copy-prohibited printed matter. As a result, the controlling section 34 controls the reading controller 33 to stop the first and second reading elements 10 and 20 from reading the image data, and prohibits the transmission of the image data to the output device 40, thereby preventing counterfeiting of the copy-prohibited printed matter.

Even when the comparing section 32 judges that at least the image data of an arbitrary color document M obtained by the visible light or the infrared light IR does not perfectly correspond to the registered pattern, if it resembles the registered pattern, the input/output device 30 makes a judgement through the following processes. The input/output device 30 examines the positional relation between and a combination of the image data of the visible light and the image data of the infrared light IR. Then, they are compared with the positional relation between and a combination of the respective registered patterns of the visible light and the infrared light IR. If they correspond to those of the registered patterns, similar to the above, the controlling section 34 stops the first and second reading elements 10 and 20 from reading the image data, and prohibits the transmission of the image data to the output device 40.

Moreover, when the input/output judgement device 30 compares the image data of the visible light and the image data of the infrared light IR, if the image data of the infrared light IR is quite different from image data which is synthetically predicted from the image data of the visible light, the controlling section 34 stops the first and second reading elements 10 and 20 from reading the image data, and prohibits the transmission of the image data to the output device 40 similar to the above.

As described above, the image reading apparatus of this embodiment includes the first and second reading elements 10 and 20 for reading the image data corresponding to the reflected light from the color document M as electric signals. The image reading apparatus is thus capable of reading image data not only from visible light but also from infrared light. With a conventional apparatus, reading image data from infrared light is unavailable. Whereas, the image reading apparatus of this embodiment is capable of reading the special distinguishing pattern of copy-prohibited printed matter printed with special ink such as infrared-light absorbing ink as well as ordinary image data.

Additionally, in the image reading apparatus, the comparing section 32 compares the image data corresponding to the visible light and the infrared light IR from an arbitrary color document M with the respective registered patterns of visible light and infrared light IR stored in the registered-pattern storage section 31. This structure enables copy-prohibited printed matter printed with special ink to be distinguished from ordinary printed matter, and prevents counterfeiting of the copy-prohibited printed matter.

Furthermore, in the image reading apparatus, the comparing section 32 compares the positional relation between and a combination of the image data corresponding to the visible light and the infrared light IR from an arbitrary color document M with the positional relation between and a combination of the registered patterns of visible light and infrared light IR. With this structure, since the color document M is examined from various directions, the accuracy of distinguishing copy-prohibited printed matter is improved. Namely, the image reading apparatus reads and copies the image data without making misjudgement and causing a user trouble.

In addition, in the image reading apparatus, when the image data corresponding to the infrared light IR differs from image data predicted from the image data corresponding to visible light, the controlling section 34 stops reading the image data and prohibits outputting of the image data. Consequently, for example, even if the special distinguishing pattern printed with special ink is made unrecognized by intentionally stopping the infrared light IR from falling onto the second reading element 20 or causing another infrared light IR to enter the second reading element 20, it is possible to prevent counterfeiting of copy-prohibited printed matter.

Also, since the image reading apparatus covers the respective light receiving sections 11, 12, 13 and 21 with the cover glass 18 and 23, it is possible to protect the respective light receiving sections 11, 12, 13 and 21 from the environmental effect.

EMBODIMENT 2

The following description discusses another embodiment of the present invention with reference to FIGS. 6 to 10. The members having the same function as in the above-mentioned embodiment will be designated by the same code and their description will be omitted.

Figure 6:
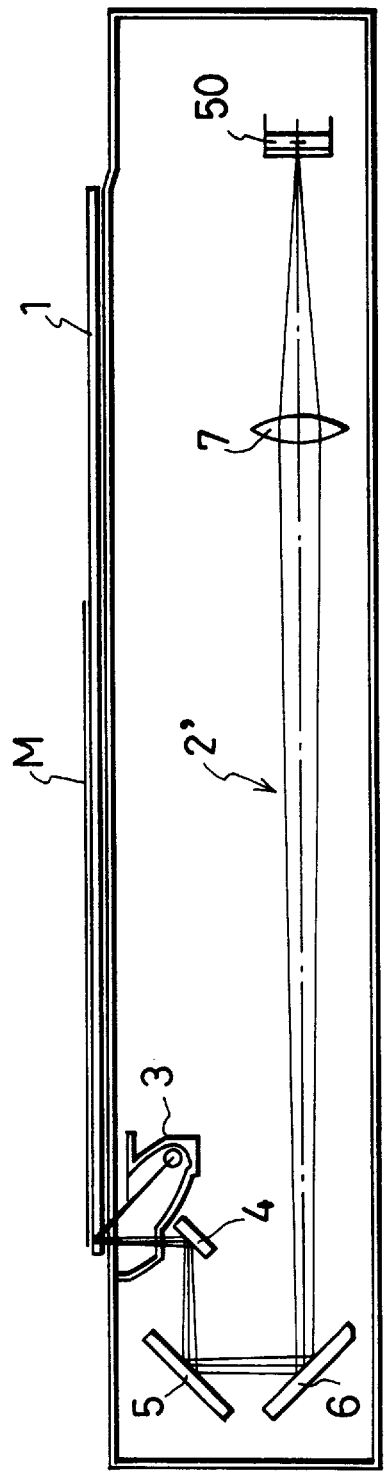
FIG. 6 is a view showing a schematic structure of an image reading apparatus according to another embodiment of the present invention.

As illustrated in FIG. 6, an image reading apparatus of this embodiment has a reading element 50 instead of the infrared-light reflecting mirror 8 and the first and second reading elements 10 and 20 constituting the image reading apparatus of EMBODIMENT 1. More specifically, an exposure optical system 2' of the image reading apparatus of this embodiment is formed by members 3 to 7 of the exposure optical system 2 of EMBODIMENT 1. Namely, the exposure optical system 2' does not include the infrared-light reflecting mirror 8. The reading element 50 is disposed on the converging point of the imaging lens 7.

Figure 7:
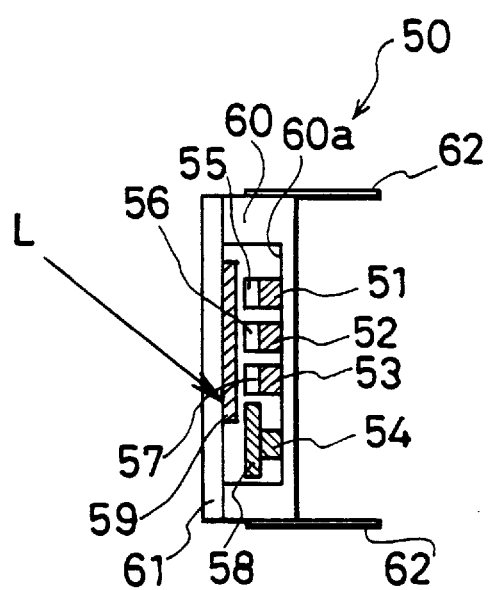
FIG. 7 is a vertical section of a reading element in the image reading apparatus of FIG. 6.

As illustrated in FIG. 7, the reading element 50 includes four (blue, green, red and infrared) lines of light receiving sections 51, 52, 53 and 54, blue, green, red and infrared filter members 55, 56, 57 and 58, a visible-light filter member 59, a base member 60, cover glass 61, and a plurality of pin terminals 62. The light receiving sections 51, 52, 53 and 54 receive reflected light from the color document M. The filter members 55, 56, 57 and 58 are mounted to face the light receiving sections 51, 52, 53 and 54, respectively. The visible-light filter member 59 is mounted to face the filter members 55, 56 and 57. The base member 60 holds these members 51 to 59 in an indented section 60a thereof. The cover glass 61 closes the indented section 60a of the base member 60. The pin terminals 62 electrically connect the reading element 50 to the input/output judgement device 30 shown in FIG. 4.

Figure 8:
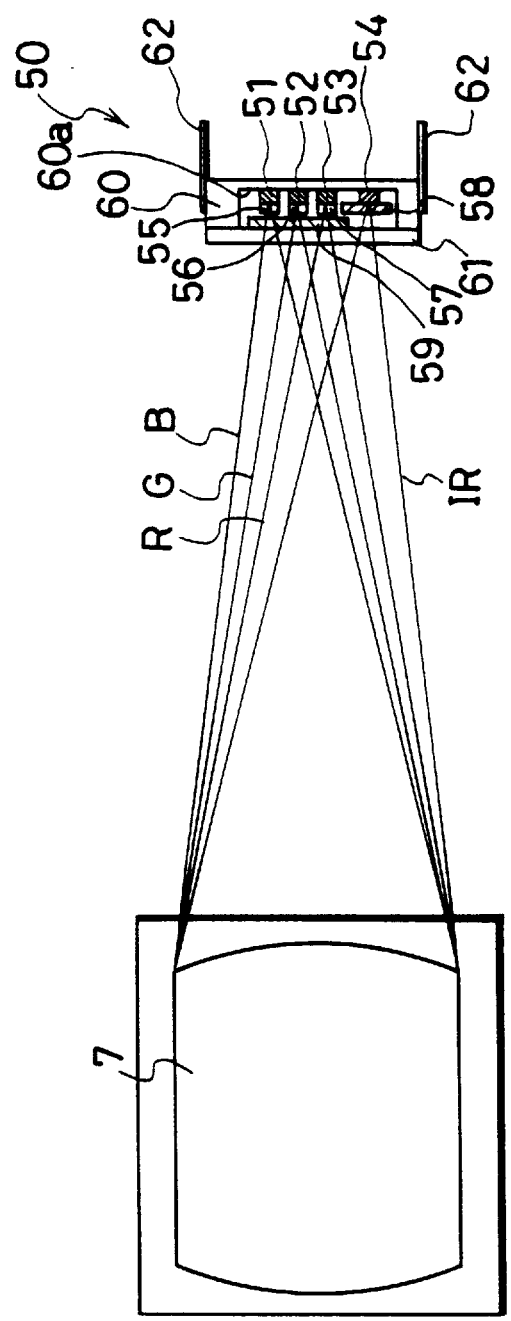
FIG. 8 is a vertical section of the reading element of FIG. 7 exposed to visible light and infrared light.

As illustrated in FIG. 8, the filter member 59 selectively transmits visible light (blue light B, green light G and red light R), and reflects or absorbs the infrared light IR. The filter member 59 usually has the spectral transmission characteristic shown by the solid line of FIG. 2. The filter member 59 has a size which is sufficient for covering the filter members 55, 56 and 57, i.e., larger than the overall size of the filter members 55, 56 and 57.

The filter member 55 selectively transmits the blue light B of the visible light, and usually has the spectral transmission characteristic shown by the solid line in FIG. 5. The filter member 56 selectively transmits the green light G of the visible light, and usually has the spectral transmission characteristic shown by the broken line in FIG. 5. The filter member 57 selectively transmits the red light R of the visible light, and usually has the spectral transmission characteristic shown by the alternate long and short dash line in FIG. 5.

The light receiving section 51 receives the blue light B transmitted through the filter member 55 and converts it to electric signals so as to obtain image data corresponding to the blue light B from the color document M. The light receiving section 52 receives the green light G transmitted through the filter member 56 and converts it to electric signals so as to obtain image data corresponding to the green light G from the color document M. The light receiving section 13 receives the red light R transmitted through the filter member 57 and converts it to electric signals so as to obtain image data corresponding to the red light R from the color document M.

The filter member 58 selectively transmits the infrared light IR, reflects or absorbs the visible light. The filter member 58 usually has the spectral transmission characteristic shown by the broken line in FIG. 2. The filter member 58 has a size larger than the size of the light receiving section 54 so as to sufficiently cover the light receiving section 54.

The light receiving section 54 is disposed next to the light receiving section 53 so that the pitch between them is greater than the line pitch of the light receiving sections 51, 52 and 53. The light receiving section 54 receives the infrared light IR transmitted through the filter member 58, and converts it to electric signals so as to obtain image data corresponding to the infrared light IR from the color document M.

Several thousands light receiving sections 51, 52, 53 and 54 are aligned in a direction perpendicular to the paper surface of FIG. 6. The filter members 58 and 59 overlap at the boundary between them. Therefore, as illustrated in FIG. 7, even if visible light L is transmitted through the visible-light filter member 59 toward the light receiving section 54, the visible light L can not reach the light receiving section 54 because it can not pass through the filter member 58. Namely, the overlapped portion does not transmit neither the visible light nor the infrared light.

Figure 9:
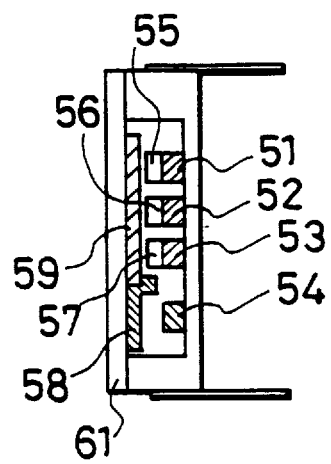
FIG. 9 is a vertical section of a reading element on which an infrared-light cut-off filter member and a visible-light cut-off filter member are integrally deposited.

The structure of the reading element 50 having the visible-light receiving sections 51, 52 and 53, and the infrared-light receiving section 54 is not particularly restricted to the above-mentioned structure. For example, as illustrated in FIG. 9,.absorbing type color glass may be used as the filter members 58 and 59. It is also possible to form the filter members 58 and 59 and the cover glass 61 as a single piece by depositing material functioning as filter on an inner surface of the cover glass 61.

Figure 10:
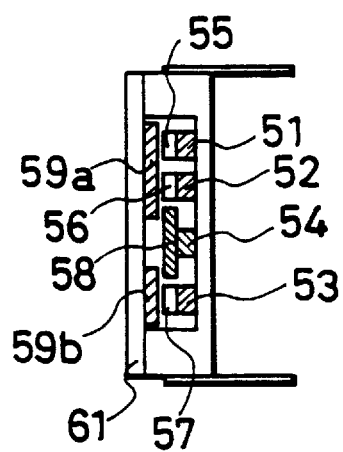
FIG. 10 is a vertical section of a reading element in which an infrared-light receiving section is disposed between a green-light receiving section and a red-light receiving section.

Furthermore, it is possible to dispose the infrared-light receiving section 54 between the light receiving sections 51, 52 and 53 for receiving blue light B, green light G and red light R. FIG. 10 shows an example where the infrared-light receiving section 54 is disposed between the green-light receiving section 52 and the red-light receiving section 53. In this case, the filter member which reflects or absorbs the infrared light IR and transmits the visible light is separated into a first filter member 59a and a second filter member 59b so that the first filter member 59a faces the filter members 55 and 56 and that the second filter member 59b faces the filter member 57.

As described above, in the image reading apparatus of this embodiment, four lines of light receiving elements 51, 52, 53 and 54 for receiving blue, green, red and infrared light form a single reading element 50. It is therefore not necessary to adjust the positions of the light receiving elements 51, 52, 53 and 54 with respect to each other. Consequently, an optical adjustment is carried out very easily.

In this apparatus, the end of the filter member 58 and the end of the visible-light filter member 59 overlap. This structure provides a portion which does not transmit neither visible light. nor infrared light IR. It is thus possible to prevent mutual interference, and to read the faithful image data without lowering the reading accuracy.

Moreover, in this apparatus, since the light receiving sections 51, 52, 53 and 54 are covered with the cover glass 61, they are protected from the environmental effect. In addition, the filter member 58 and the visible-light filter member 59 are integrally mounted on the inner surface of the cover glass 61. Such a simplified structure improves the productivity. Moreover, this structure prevents remodeling of the apparatus, for example, removal of the filter members 58 and 59 for illegal reading and copying, and achieves a safer image reading apparatus.

EMBODIMENT 3

The following description discusses still another embodiment of the present invention with reference to FIGS. 11 to 19.

Figure 13:
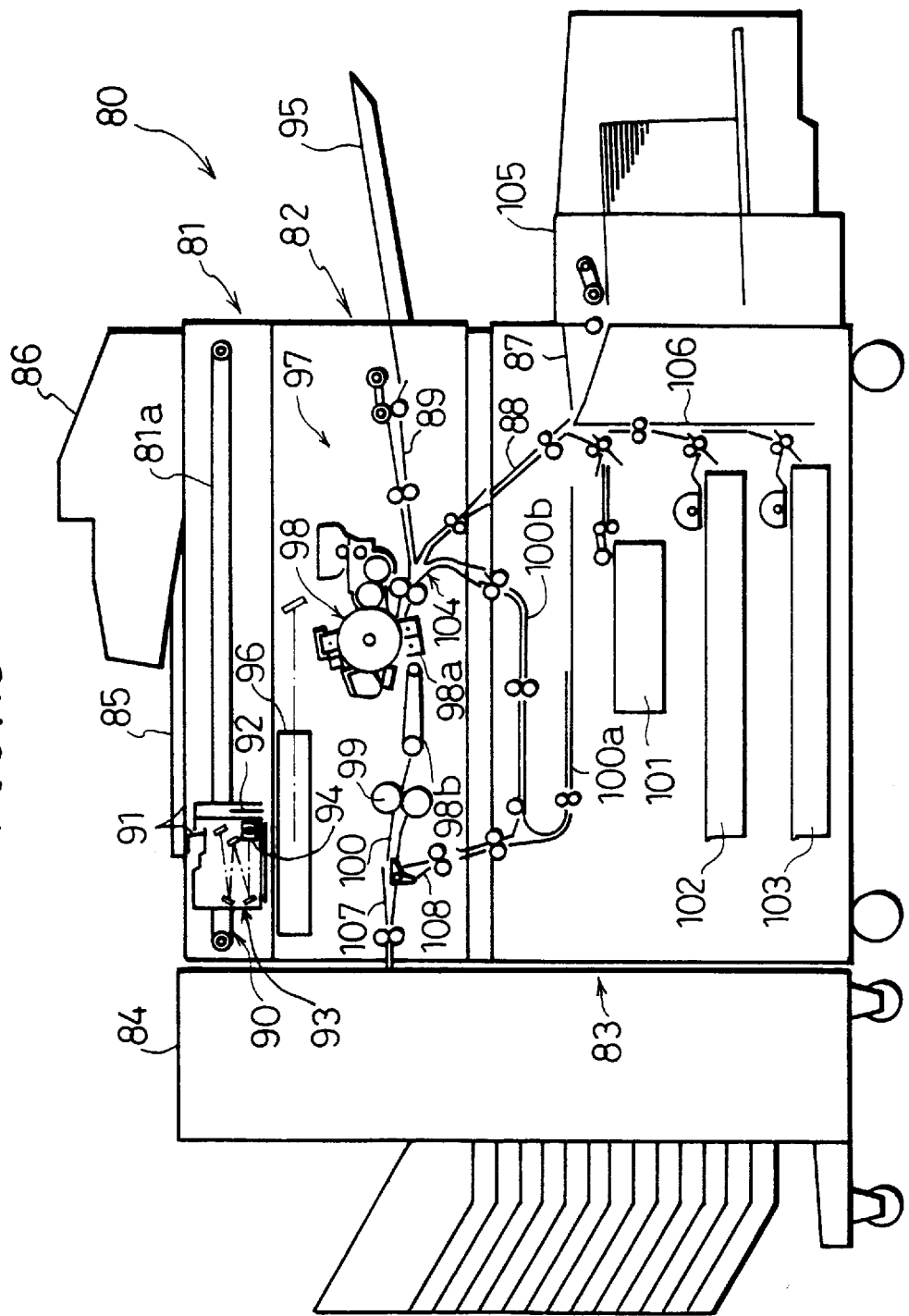
FIG. 13 is a view showing a schematic structure of an image processor incorporating the image reading apparatus of FIG. 11.

First, a digital copying machine is explained as an image processor incorporating an image reading apparatus of the present invention. As illustrated in FIG. 13, a main body of the digital copying machine is provided with a scanner section 81, a laser printer section 82, a multi-level paper feeding unit 83 and a sorter 84.

The scanner section (image reading apparatus) 81 includes a document platen 85, an automatic document feeder (ADF) 86, a scanner unit 90, and an endless driving wire 81a. The driving wire 81a moves the scanner unit 90 along the lower surface of the document platen 85. For example, an automatic reversible document feeder (RDF) is used as the ADF 86.

Figure 11:
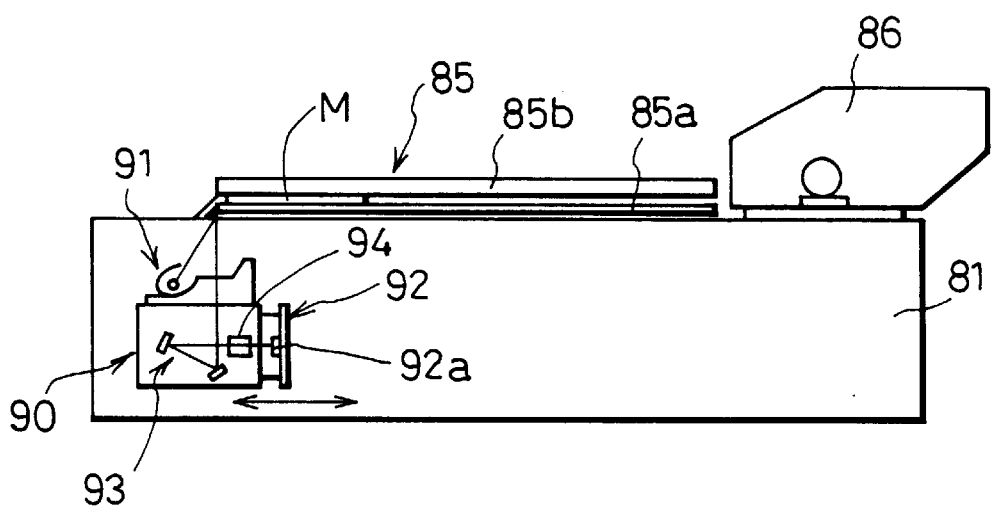
FIG. 11 is a view showing a schematic structure of an image reading apparatus according to still another embodiment of the present invention.

As illustrated in FIG. 11, the document platen 85 is formed by a glass table 85a made of transparent glass and a document holding section 85b for pressing a color document M. A (lower) surface of the document holding section 85b facing the glass table 85a is white in color so that regions around the color document M, i.e., regions other than the color document M come out in white when copied.

As illustrated in FIG. 13, the multi-level paper feeding unit 83 includes a first cassette 101, a second cassette 102, a third cassette 103, and an optional large-capacity cassette 105. Each of the cassettes 101, 102, 103, and 105 contains sheets of paper, and one sheet is taken out from the top at a time and fed to the laser printer section 82.

A plurality of color documents M (hereinafter simply referred to as the documents) are set on the ADF 86 at a time. The ADF 86 automatically sends a sheet of document at a time to an upper section of the document platen 85 and feeds the document in a predetermined direction so that the scanner unit 90 selectively reads one side or both sides of the document according to the user's choice.

As illustrated in FIG. 11, the scanner unit 90 includes a lamp reflector assembly 91, a reader unit 92, a plurality of reflecting mirrors 93, and a lens 94. The lamp reflecting assembly 91 is a light source for irradiating a document. The reader unit 92 includes a charge coupled device (CCD) 92a. The plurality of reflecting mirrors 93 guide reflected light from the document to the reader unit 92. The lens 94 focuses reflected light from the document on a light receiving surface of the CCD 92a of the reader unit 92. The reader unit 92 may include a photoelectric converter element of another type instead of the CCD 92a.

As illustrated in FIG. 13, when scanning the document on the document platen 85, the scanner section 81 reads the image on the document by moving the scanner unit 90 along the lower surface of the document platen 85 by the driving wire 81a. When the ADF 86 is used, the scanner section 81 stops the scanner unit 90 at a predetermined position below the ADF 86 and reads the image on the document while feeding the document by the ADF 86.

When the scanner unit 90 reads the image on the document in the above-mentioned manner, the image data is obtained. The obtained image data is sent to an image processing circuit, to be described later, for various processing, and temporarily stored in a memory 123 (see FIG. 14) of the image processing circuit. The image data is output from the memory 123 to the laser printer section 82 upon an outputting instruction. The laser printer section 82 forms the image on a sheet.

The laser printer section 82 has a manual feed tray 95, a laser writing unit 96, and an electrophotographic processing section 97 for forming an image. The laser writing unit 96 includes a semiconductor laser, a polygon mirror and f-θ lens, none of them are shown. The semiconductor laser emits laser light according to the image data from the memory 123. The polygon mirror deflects the laser light at a constant angular velocity. The f-θ lens adjusts the resulting laser light so that it is deflected at a constant velocity on a photoreceptor drum 98 of the electrophotographic processing section 97.

As generally known, the electrophotographic processing section 97 has a charger, a developing device, a transfer device 98a, a separating device, a cleaning device and a charge removing device around the photoreceptor drum 98. Additionally, a fixing device 99 is disposed on a sheet discharging side of the transfer device 98a, and a transporting belt 98b is arranged between the transfer device 98a and the fixing device 99. A portion of the photoreceptor drum 98 facing the transfer device 98a is an image forming position.

The fixing device 99 fixes the image on the sheet. A transport path 100 is formed on a downstream portion in a sheet feeding direction in the fixing device 99. The transport path 100 is separated into a transport path 107 extending to the sorter 84 and a transport path 108 extending to the multi-level paper feeding unit 83 below the laser printer section 82. The transport path 108 is further separated into a reverse transport path 100a and a double-sided/composite transport path 100b in the multi-level paper feeding unit 83.

In a double-sided copy mode in which both sides of a document are copied, the reverse transport path 100a turns over a sheet onto which the image is transferred and fixed. In the double-sided copy mode, the sheet which has been turned over through the reverse transport path 100a is transported to the image forming position of the photoreceptor drum 98 through the double-sided/composite transport path 100b. In a single-sided composite copy mode, the sheet is transported to the image forming position of the photoreceptor 98 along the double-sided/composite transport path 100b without being reversed. The single-sided composite copy mode is selected when making a composite copy by forming the images of a plurality of documents together on one of the sides of a sheet or by forming the image of a document on one of the sides of a sheet using toner of more than one color.

The multi-level paper feeding unit 83 includes a common transport path 106. Sheets from the first cassette 101, the second cassette 102, and the third cassette 103 are transported to the electrophotographic processing section 97 through the common transport path 106. The common transport path 106 joins the transport path 87 from the large-capacity cassette 105 on a way to the electrophotographic processing section 97, and extends to the transport path 88. The transport path 88, the double-sided/composite transport path 100b, the transport path 89 from the manual feed tray 95 meet at a confluence 104. The joined transport paths 88, 100b and 89 extend to the image forming position. The confluence 104 is located adjacent to the image forming position.

The image data read by the scanning section 81 is stored in the memory 123 of the image processing circuit. The image data read from the memory 123 is converted to a laser beam corresponding to the image data by the laser writing unit 96. The laser writing unit 96 scans the laser beam on the surface of the photoreceptor drum 98 to form an electrostatic latent image thereon. The electrostatic latent image is then changed into visible form to produce a toner image. The toner image is electrostatically transferred and fixed to a sheet fed by the multi-level paper feeding unit 83.

The sheet carrying the image is transported from the fixing device 99 along the transport paths 100 and 107, and discharged onto the sorter 84, or transported from the fixing device 99 to the reverse transport path 100a or the double-sided/composite transport path 100b along the transport paths 100 and 108 when making a double-sided copy or composite copy.

Figure 14:
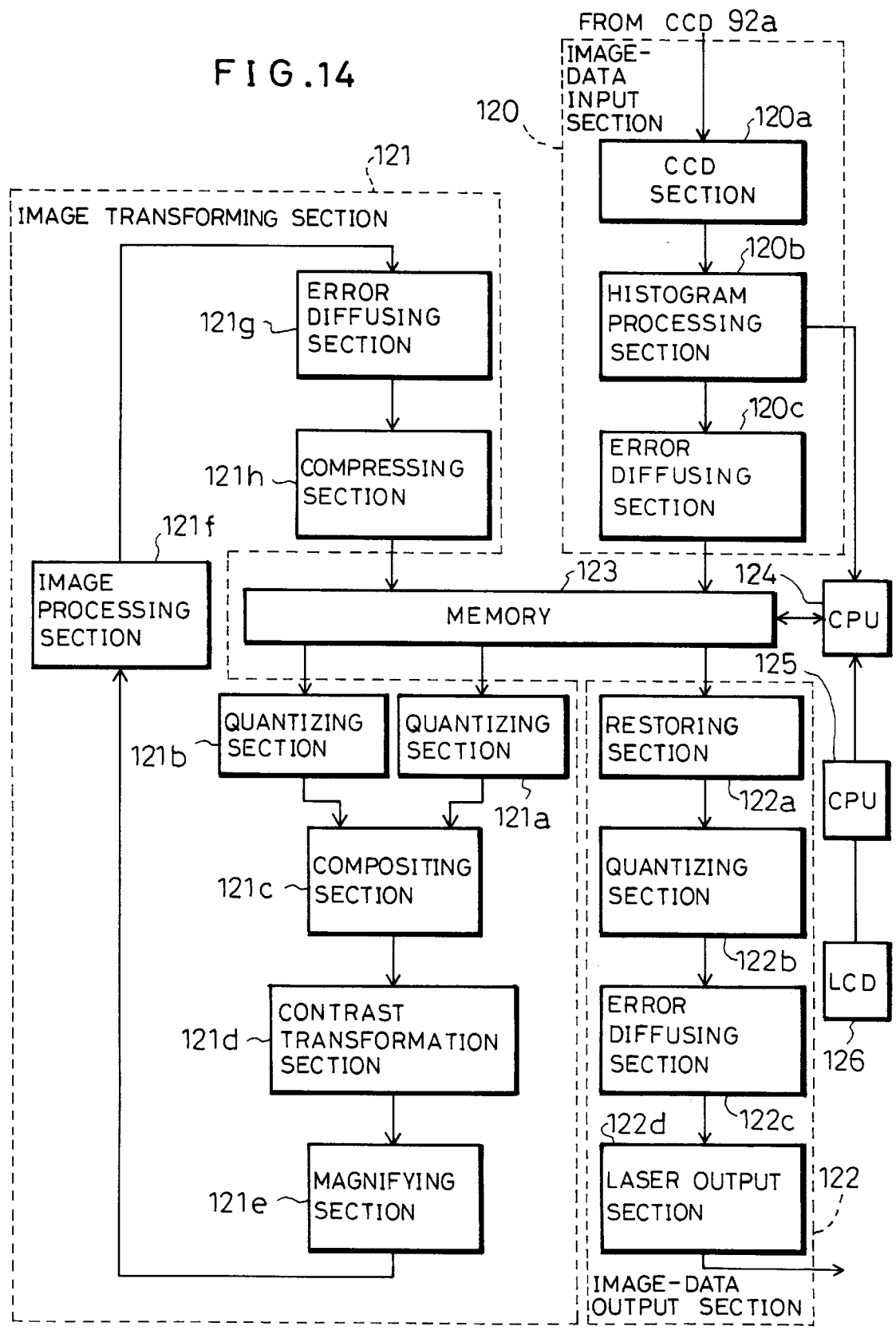
FIG. 14 is a block diagram of an image processing circuit in the image processor of FIG. 13.

The following description explains the structure and function of the image processing circuit incorporated into the above-mentioned digital copying machine with reference to the block diagram of FIG. 14.

As illustrated in FIG. 14, the image processing circuit includes an image-data input section 120, an image transformer section 121, an image-data output section 122, a memory 123 such as a RAM (random access memory), and a central processing unit (CPU) 124.

The CPU (recognizing means) 124 performs various operations for the image processing. The CPU 124 is connected to a liquid crystal display (LCD) 126 through a CPU 125. The LCD 126 displays a set density and magnification of copy, selectable sizes of sheet and image processing functions, and the information about setting and selection.

A transparent touch panel, not shown, is provided as a manipulating section on the LCD 126. The density and magnification of copy are set and a sheet size and an image processing function are selected by pressing the LCD 126 through the transparent touch panel. The copying start key and ten keys, not shown, are provided near the LCD 126. The CPU 125 controls the display of the LCD 126, and key scan of the transparent touch panel, the copying start key and the ten-key.

The CPU 124 performs functions similar to those of the input/output judgement device 30 described in EMBODIMENT 1 (see FIG. 4). More specifically, the CPU 124 is provided with the comparing section (comparing means) and the reading controller, not shown, in order to prevent counterfeiting of copy-prohibited printed matter such as paper money and securities. Since the functions of the CPU 124 are described in detail in EMBODIMENT 1, they are not explained here.

The CPU 124 recognizes the boundary between ordinary colored printed matter or copy-prohibited printed matter and the white background of the document holding section 85b in the image data from the CCD 92a. Namely, the CPU 124 performs edge detection to detect the edge of the document, and position detection to detect the position of the document on the glass table 85a. The CPU 124 then distinguishes a specific feature, i.e., pattern of the copy-prohibited printed matter from the image data. The edge detection and the position detection will be described later in detail.

The pattern is stored in the memory 123. The memory (storage means) 123 performs the function of the registered-pattern storage section (registered-pattern storage means) and is capable of storing the patterns of several kinds of copy-prohibited printed matter. The memory 123 updates or erases the stored patterns as the need arises.

In addition, the CPU 124 performs a registration function to newly register a pattern of copy-prohibited printed matter, and an updating function to update the pattern. The registration function and the updating function are selected by pressing predetermined positions on the transparent touch panel.

The image-data input section 120 includes a CCD section 120a, a histogram processing section 120b, and an error diffusing section 120c. The image-data input section 120 converts the image data of the document read by the CCD 92a (see FIG. 11) of the reading unit 92 into binary form, and processes the image data by an error diffusion method while making a histogram. The processed image data is temporarily stored in the memory 123.

The processing of the image data in the image-data input section 120 is further explained below. First, in the CCD section 120a, analog signals representing the density of each pixel of the image data input by the CCD 92a are converted to digital signals, and correction of MTF (modulation transfer function), black-and-white level or gamma is carried out. Then, digital signals representing 256 tones (8 bits) are transmitted to the histogram processing section 120b.

In the histogram processing section 120b, the digital signal input from the CCD section 120a is added according to the pixel density of 256 tones to obtain density information (histogram data). The density information is sent to the CPU 124 if necessary or to the error diffusing section 120c as pixel data.

In the error diffusing section 120c, the 8-bit/pixel digital signal input from the histogram processing section 120b is converted to 1-bit (binary) signal by the error diffusion processing method, and relocation is performed for faithfully reproducing the density of local portions of the document. The error diffusion processing method is a type of pseudo-half-tone processing, and an error caused by conversion to binary form is reflected when converting adjacent pixel into binary form.

The image transformer section 121 includes quantizing sections 121a and 121b, a compositing section 121c, a contrast transformation section 121d, a magnifying section 121e, an image processing section 121f, an error diffusing section 121g, and a compressing section 121h. The image transformer section 121 converts the input image data into image data of a form desired by a user. The image transformer section 121 processes the image data until all the image data is converted into the desired form and stored in the memory 123. The processing sections 121a to 121h in the image transformer section 121 do not always perform their functions but perform their functions if need be.

The functions of the processing sections 121a to 121h are explained below in detail. The image data which has been converted into binary form by the error diffusing section 120c is reconverted to 256 tones. In the compositing section 120c, a logical operation, i.e., logical OR, AND, or exclusive-OR operation is selectively carried out with respect to each pixel. The data subjected to the operation is the image data stored in the memory 123 and bit data from a pattern-generator (P.G., not shown) storing preset characters and symbols.

In the contrast transformation section 121d, the relation between the output density and input density is freely determined according to a predetermined contrast transformation table with respect to the respective digital signals of 256 tones. In the magnifying section 121e, interpolation is performed based on the input data according to a magnification factor specified by a user to obtain pixel data (a density level) of target pixels after magnified. And, magnification of main scanning is changed after changing magnification of sub-scanning.

In the image processing section 121f, the input image data is processed to collect information about the data rows, such as feature extraction. The error diffusing section 121g performs a function similar to that of the error diffusing section 120c of the image-data input section. In the compressing section 121h, the binary data is compressed by run length encoding. The compressing section 121h performs compressing in the final processing loop when the image data to be output last is obtained.

The image-data output section 122 includes a restoring section 122a, a quantizing section 122b, an error diffusing section 122c, and a laser output section 122d. The image-data output section 122 restores the image data stored in compressed form in the memory 123, reconverts it to data of 256 tones, diffuses an error caused when obtaining quaternary data corresponding to a half-tone image which is smoother than the image formed by binary data, and transfers the image data from the laser output section 122d to the semiconductor laser in the laser writing unit 96 (see FIG. 13).

The image data processing performed in the image-data output section 122 is further explained below. First, the image data compressed by the compressing section 121h is restored in the restoring section 122a. The quantizing section 122b performs processing similar to that performed in the quantizing sections 121a and 121b of the image transformer section 121. The error diffusing section 122c performs processing similar to that performed by the error diffusing section 120c of the image-data input section 120.

The laser output section 122d converts the digital image data into an ON/OFF signal for switching the semiconductor laser between ON and OFF according to a control signal from a sequence controller, not shown. The semiconductor laser is switched ON or OFF by the ON/OFF signal. The image data processed by the image-data input section 120 and the image-data output section 122 is basically stored in binary form in the memory 123 in order to save the capacity of the memory 123. However, considering deterioration of the image data, it is also possible to process the image data in quaternary form.

The following description discusses the registration function and updating function in the digital copying machine having the above-mentioned structure.

For example, when registering the pattern of copy-prohibited printed matter such as paper money and securities, the copy-prohibited printed matter (document M) is placed on the glass table 85a of the document platen 85 and pressed by the document holding section 85b as shown in FIG. 11. Next, the image on the document M is read by scanning the document M while moving the scanner unit 90 along the lower surface of the document platen 85.

Figure 12:
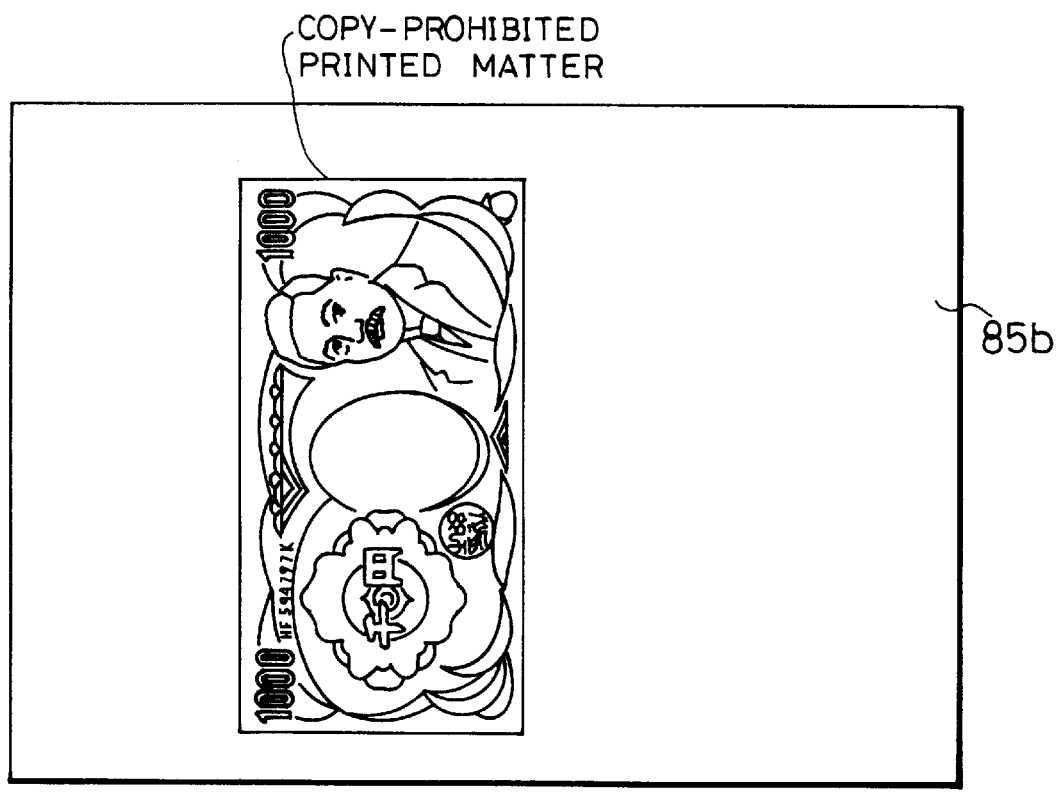
FIG. 12 is a view showing the image reading apparatus of FIG. 11 having copy-prohibited printed matter placed thereon.

As illustrated in FIG. 12, the copy-prohibited printed matter is colored, while the lower surface of the document holding section 85b is white. The CPU 124 performs edge detection processing and position detection processing on the image data from the CCD 92a according to the difference in color between the copy-prohibited printed matter and the lower surface of the document holding section 85b.

The edge detection performed by the CPU 124 is discussed below. First, half-tone image processing executed prior to the edge detection is explained.

The half-tone image processing is an operation to reduce the number of tones of each pixel when printed (copied) by reducing the volume of data per pixel in the digital image data. This processing permits the space of memory used for storing the image data to be reduced, and the image data to be printed with a printing machine having a rather small tonal range.

Figure 15:
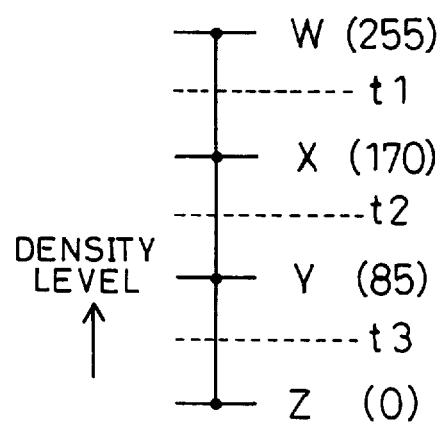
FIG. 15 is a view explaining quantization of image data performed by a CPU constituting the image processing circuit of FIG. 14.

The half-tone image processing is performed as follows. First, the image-data input section 120 reads a density level ranging from 0 to 255 tones of each pixel in the image data from the CCD 92a. The CPU 124 quantizes the read image data as shown in FIG. 15. Namely, the CPU 124 quantizes the image data into four quantized values: W (density level 255), X (density level 170), Y (density level 85), and Z (density level 0) according to the relation to the three threshold values t1, t2, and t3 (t1>t2>t3).

For example, denoting the density level of the image data as f, the CPU 124 sets the density level of the image data to the quantized value X when $t1 \geq f > t2$, to the quantized value Y when $t2 \geq f > t3$, and to the quantized value Z when $t3 \geq f \geq 0$. The threshold values t1, t2 and t3, and the quantized values W, X, Y and Z are predetermined with respect to 0 to 255 density levels.

Figure 17:
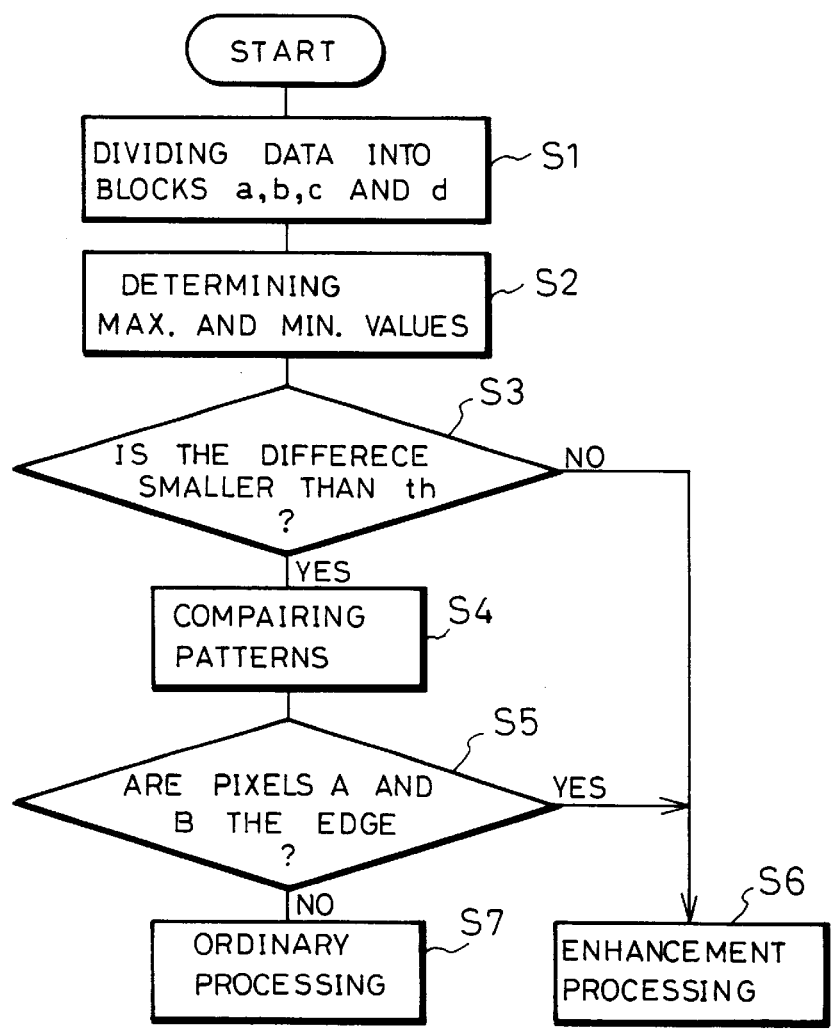
FIG. 17 is a flowchart showing the steps in the processing to be performed by the CPU.

The CPU 124 processes the quantized image data through the flowchart shown in FIG. 17.

Figure 16:
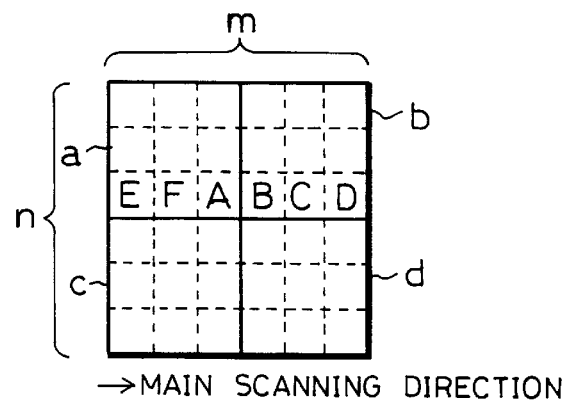
FIG. 16 is a view explaining processing performed by the CPU.

First, as illustrated in FIG. 16, n×m ($n \geq 1$, and $m \geq$ the number of target pixels to be processed) image data including the target pixels is divided into four blocks a, b, c and d (step 1). The quantized values of the pixels in each of the blocks a, b, c and d are added up, and the four totals are compared so as to determine the maximum and minimum values (step 2). The difference between the maximum and minimum values is calculated, and whether the difference is larger than a predetermined threshold value th or not is judged (step 3).

If the difference is smaller than the threshold value th, a pixel A in the block a and adjacent pixel B in the block b are made target pixels. Next, the pattern of the quantized values of six pixels E, F, A, B, C and D arranged successively in the main scanning direction (printing direction) and a predetermined edge detection pattern are compared with each other (step 4). Then, whether the patterns are identical or not, i.e., whether the target pixels A and B are the edge (boundary) portion of the image data of the document are judged (step 5).

If the patterns are identical, i.e., if the target pixels A and B represent the edge, enhancement processing is performed on the edge (step 6). On the other hand, if the patterns are not identical, i.e., if the target pixels A and B do not represent the edge, ordinary processing is performed (step 7). In step 3, if the difference between the maximum and minimum values is larger than or equal to the threshold value th, enhancement processing is performed (step 6).

The ordinary processing is carried out by calculating the following equations. Assuming that the density levels (quantized values: W=3, X=2, y=1 and Z=0) of the target pixels A and B before being processed are A0 and B0, the density levels of the target pixels A and B after being processed are A1 and B1 and that the number of quantized values is N, A1=0 and B1=A0+B0, or
when B1>n−1,
A1=A0+B0−(n+1) and B1=(n−1)

Meanwhile, the enhancement processing is carried out by performing the following processing.

When A0≠0 and B0≠0, A1=A0+1 and B1=B0+1.
When A0=0 and B0≠0, A1=A0 and B1=B0+1.
When A0≠0 and B0=0, A1=A0+1 and B1=B0.
When A0=0 and B0=0, A1=A0 and B1=B0.

When edge detection and the above processing of the target pixels A and B are complete, the pixels C and D shown in FIG. 16 are made target pixels, and edge detection and the processing are carried out in the above-mentioned manner. The CPU 124 performs edge detection and processing, i.e., half-tone image processing on the all the quantized image data to distinguish the edge of the image data of the document. When the half-tone image processing is performed, the quantized image data is transferred as a copied image onto a sheet.

Thus, the quality of the image has improved tonal appearance compared with the quality of the image obtained by the conventional half-tone image processing. More specifically, the CPU 124 quantizes the input image data, and performs edge detection and processing on the quantized data in sequence along the main scanning direction. With this arrangement, the digital copying machine restricts deterioration of the image quality caused by a variation in the rotation of the photoreceptor drum 98 of the laser printer section 82 (see FIG. 13) during image formation, thereby achieving improved tonal appearance of the image.

Figure 18:
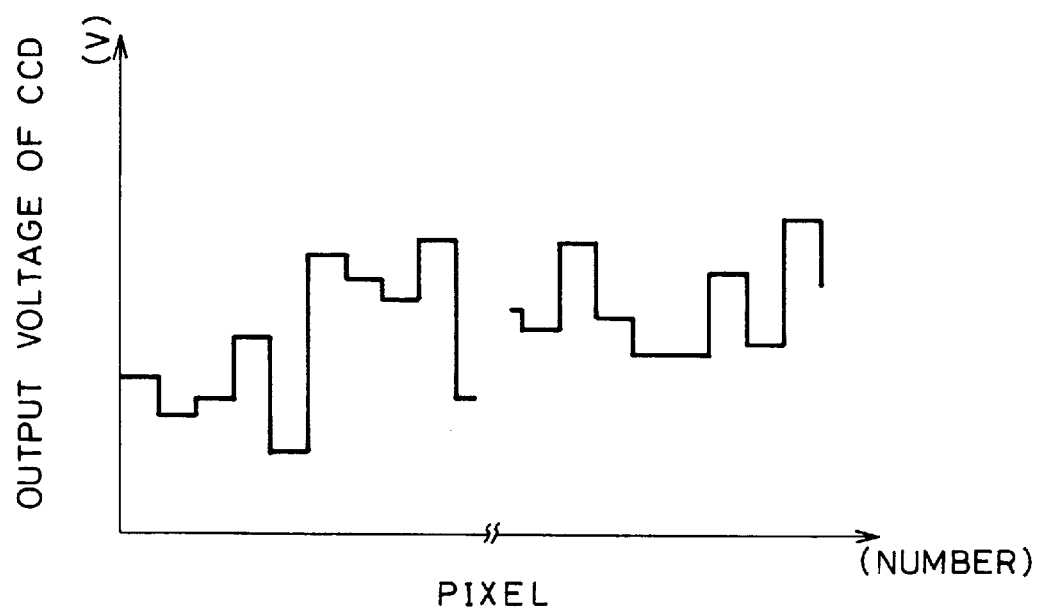
FIG. 18 is a graph showing a relationship between an output voltage of a CCD in the image processor of FIG. 13 and pixels.

Since the document on the document platen 85 is copy-prohibited printed matter, when the CPU 124 distinguishes the edge in the image data of the document, the pattern of the image data is newly registered. More specifically, as illustrated in FIG. 18, the CPU 124 recognizes the pattern of the image data as an output voltage (V) of the CCD 92a of the reading unit 92 and stores it in the memory 123. The patterns of several kinds of copy-prohibited printed matter are stored depending on the capacity of the memory 123. Execution of registration is instructed by pressing the transparent touch panel.

Figure 19:
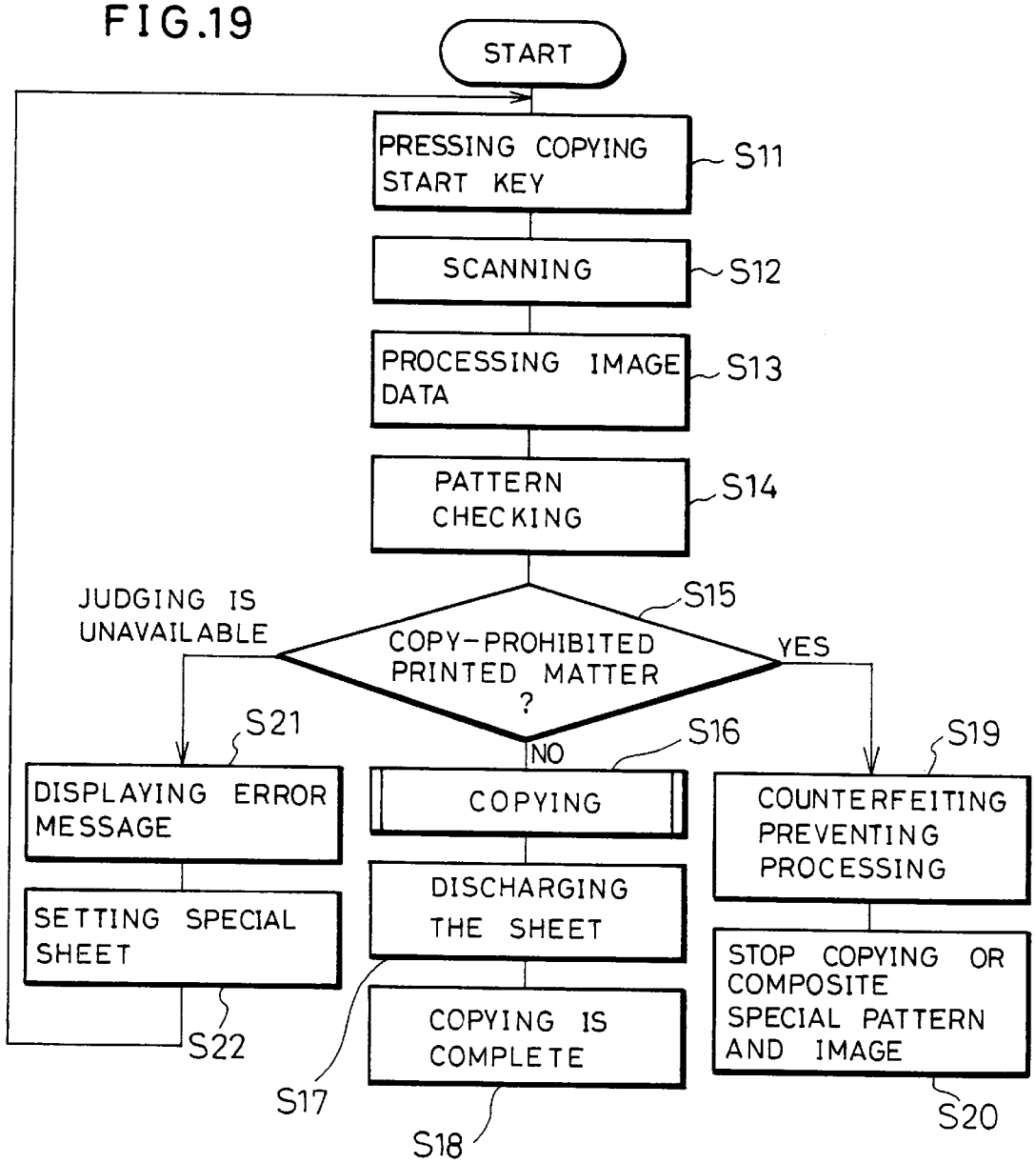
FIG. 19 is a flowchart showing a process of preventing counterfeiting of copy-prohibited printed matter to be performed by the CPU.

Next, how the CPU 124 prevents counterfeiting of copy-prohibited printed matter is explained with reference to the flowchart of FIG. 19.

First, the document is placed on the document platen 85 and the copying start key is pressed (step 11). The document is scanned (step 12). Then, the image data is processed in the above-mentioned manner (step 13). Subsequently, the pattern of the image data and the registered pattern in the memory 123 are compared or checked (step 14) to judge whether the document is copy-prohibited printed matter or not (step 15). The judgement is made according to a predetermined judgement standard.

If the document is not copy-prohibited printed matter, a series of copying operations is performed (step 16), the sheet is discharged (step 17) and copying is complete (step 18). On the other hand, if the document is copy-prohibited printed matter, an operation to prevent counterfeiting is performed (step 19), and copying is stopped or a specific pattern and the image data are composited (step 20). Compositing is performed, by superimposing a message (specific pattern) such as "copy-prohibited printed matter" and "copy" on the image of the document when printing a copy of the image on the sheet.

If judging whether the document is copy-prohibited printed matter or not is unavailable in step 15, i.e., if the edge of the document is almost white and is hardly distinguished from the white color of the document holding section 85b (see FIG. 11), an error message is displayed on the LCD 126 shown in FIG. 14 (step 21). Then, an instruction to place a special sheet over the document on the document platen 85 is given (step 22), and the operation proceeds to step 11. The special sheet is a sheet having a color other than white and a size slightly larger than the size of the document. The special sheet is laid over the document to detect the edge and position of the document on the document platen 85. It is desirable that the special sheet has a rather soft color to prevent a problem from being caused in pattern checking.

As described above, the CPU 124, i.e., the digital copying machine of this embodiment easily registers and updates the pattern of the image data of copy-prohibited printed matter. It is thus possible to prevent counterfeiting of copy-prohibited printed matter.

EMBODIMENT 4

Figure 20:
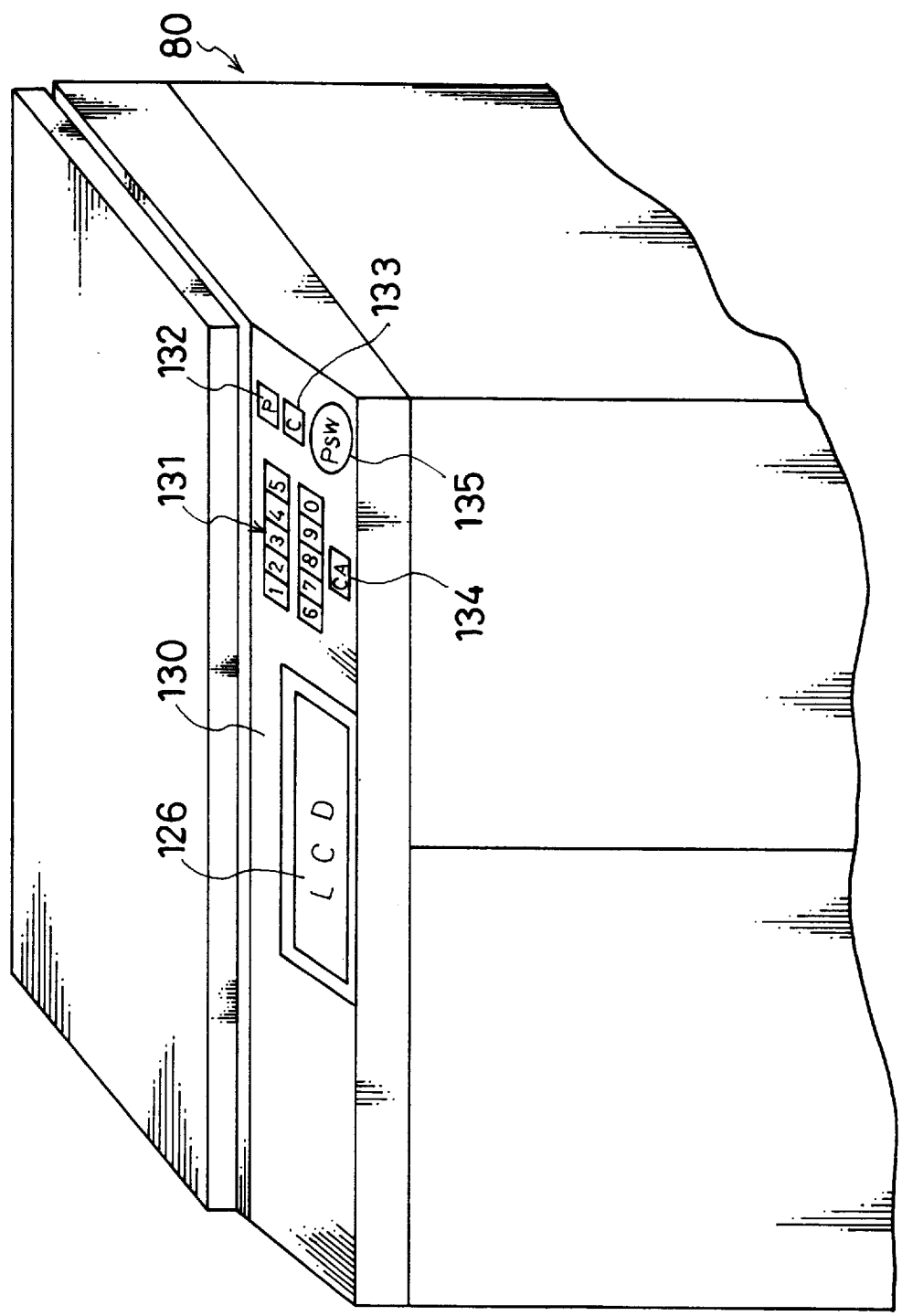
FIG. 20 is a schematic perspective view showing an image processor incorporating an image reading apparatus according to still another embodiment of the present invention.
Figure 21:
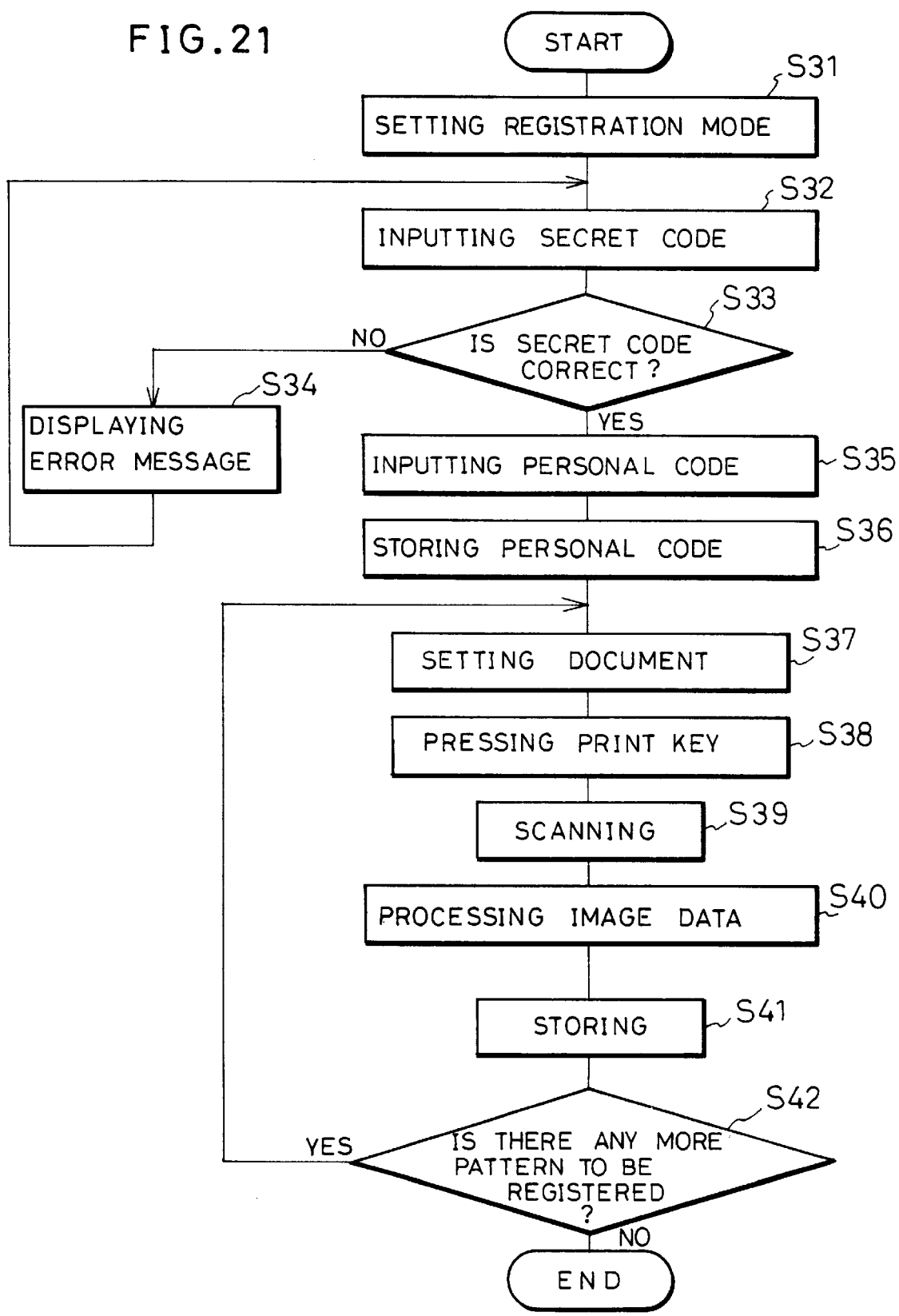
FIG. 21 is a flowchart showing the steps of operating a registration function and an updating function to be performed by a CPU in the image processor of FIG. 20.

The following description discusses still another embodiment of the present invention with reference to FIGS. 20 and 21. The members having the same function as those of the digital copying machine of EMBODIMENT 3 will be designated by the same code and their description will be omitted.

As illustrated in FIG. 20, a digital copying machine as an image processor of this embodiment includes a console panel 130 at the top of the main body 80. The console panel 130 is provided with the LCD 126, a ten-key input section 131, a PAUSE key 132, a CLEAR key 133, a CANCEL key 134, and a PRINT key 135.

The LCD 126 is provided with a transparent touch panel, not shown, as a control section. Setting and selecting operations are performed by pressing the LCD 126 through the transparent touch panel.

The ten-key input section (input means) 131 is pressed when setting the number of copies to be produced. The ten-key input section 131 is pressed when inputting a secret code and a personal code. The PAUSE key 132 is pressed when interrupting a copying operation, a setting operation or a selecting operation. The CLEAR key 133 is pressed when cancelling the set number of copies to be produced, or stopping the copying operation. The CANCEL key 134 is pressed when cancelling all the functions to return to the initial screen. The PRINT key 135 is pressed when starting a copying operation.

The memory 123 is capable storing registered secret and personal codes. The CPU 124 judges whether a secret code or a personal code input through the ten-key input section 131 is correct by comparing it with the secret or personal code stored in the memory 123. When the input secret or personal code is correct, the CPU 124 registers or updates the pattern of copy-prohibited printed matter.

More specifically, if registration of the pattern of copy-prohibited printed matter is carried out by a number of unspecified people, the effect of preventing counterfeiting is lowered. Therefore, the digital copying machine of this embodiment uses secret and personal codes and permits only the specified people to register the pattern of copy-prohibited printed matter. Moreover, the use of secret and personal codes enables the management of the users. Unless particularly specified here, the digital copying machine of this embodiment has the same structures as the digital copying machine of EMBODIMENT 3.

With reference to the flowchart of FIG. 21, the following description discusses how the pattern of copy-prohibited printed matter is registered and updated by the CPU 124 in the digital copying machine having the above-mentioned structure.

First, a registration mode is set by pressing the transparent touch panel (step 31). When a secret code is input (step 32), whether the secret code is correct or not is verified (step 33). If the secret code is correct, the operation proceeds to step 35. On the other hand, if the secret code is incorrect, an error message is displayed on the LCD 126 (step 34) and the operation returns to step 32. Next, when a personal code is input (step 35), the personal code is stored (step 36).

Subsequently, copy-prohibited printed matter as a document to be registered is placed on the document platen 85 (step 37), and the PRINT key 135 is pressed (step 38) to scan the copy-prohibited printed matter (step 39). Then, the image data is processed (step 40) and the processed image data is stored in the memory 123 (step 41). If the pattern of another copy-prohibited printed matter is to be successively registered (step 42), steps 37 to 42 are repeatedly performed, and then the registration of the pattern of copy-prohibited printed matter is complete.

As described above, the CPU 124 verifies if the secret code is correct before scanning copy-prohibited printed matter. This arrangement enables the CPU 124, i.e., the digital copying machine of this embodiment to enhance the effect of preventing counterfeiting of copy-prohibited printed matter.

EMBODIMENT 5

Figure 22:
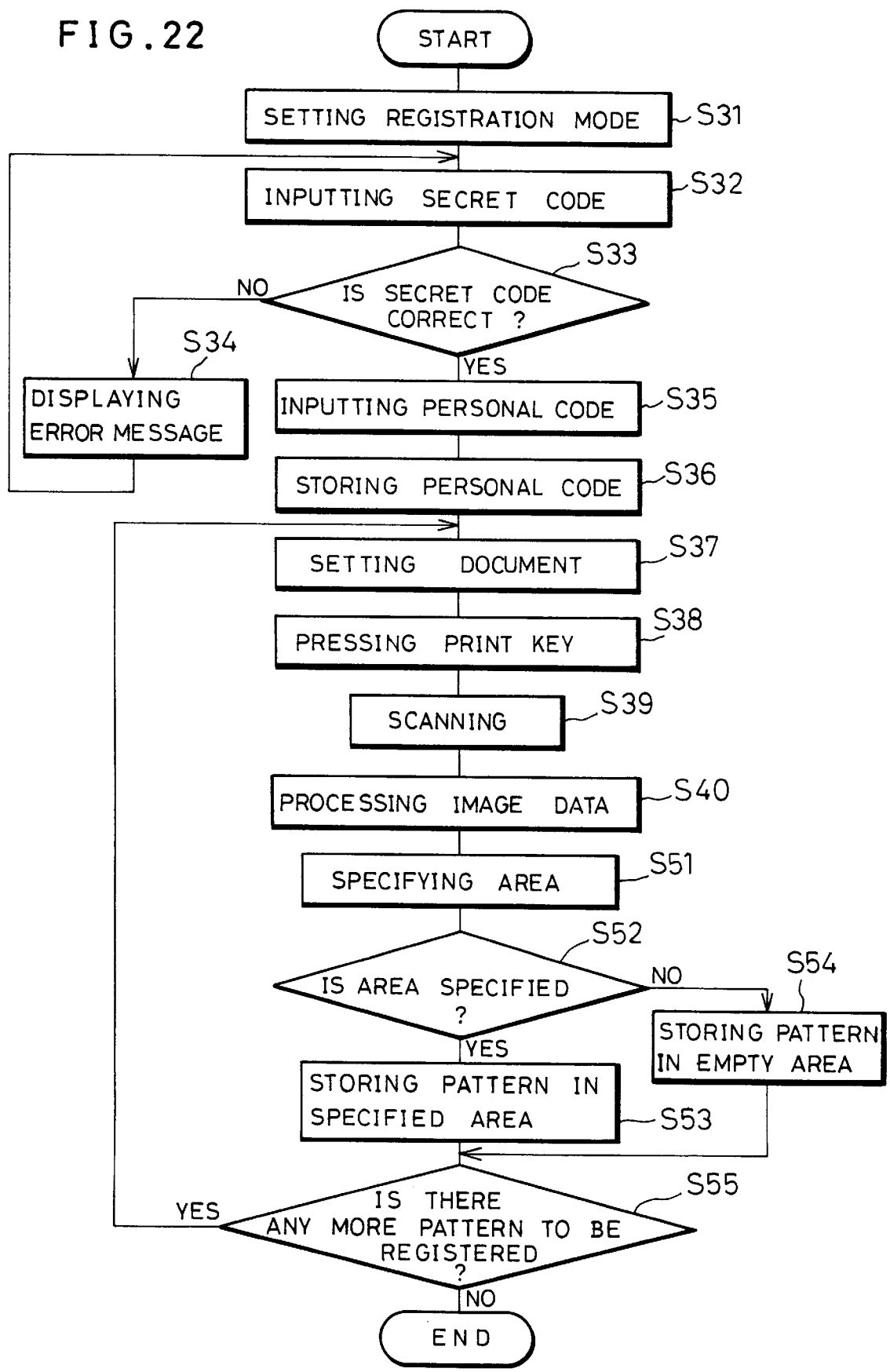
FIG. 22 is a flowchart showing steps of performing a registration function and an updating function in a CPU in an image processor incorporating an image reading apparatus according to still another embodiment of the present invention.

The following description discusses still another embodiment of the present invention with reference to FIG. 22. The members having the same function as those of the digital copying machine of EMBODIMENT 4 will be designated by the same code and their description will be omitted.

A digital copying machine as an image processor of this embodiment performs the following functions. The CPU 124 prohibits updating and erasing of the pattern of particular copy-prohibited printed matter stored in the memory 123. The term "copy-prohibited printed matter" means printed matter, such as paper money, which would not usually been updated for a long time (or at least a period of time longer than the life of the digital copying machine). The particular copy-prohibited printed matter is specified by a user or a manufacturer.

The memory 123 is capable of storing the patterns of several kinds of copy-prohibited printed matter, and registration and updating of the patterns of the copy-prohibited printed matter are performed using an empty area in the memory 123. The empty area means an area where the pattern of the specified copy-prohibited printed matter is not registered. The CPU 124 stores the pattern of the specified copy-prohibited printed matter in a specified area of the memory 123 in order to distinguish between the specified copy-prohibited printed matter and newly registered copy-prohibited printed matter.

The CPU 124 updates only the pattern of newly registered copy-prohibited printed matter other than the specified copy-prohibited printed matter. Except for this function, the structure of the digital copying machine of this embodiment is the same as that of the digital copying machine of EMBODIMENT 4.

The following description discusses how the pattern of copy-prohibited printed matter is registered and updated by the CPU 124 in the digital copying machine having this structure with reference to the flowchart of FIG. 22.

First, a registration mode is set (step 31), a secret code is input (step 32), and whether the secret code is correct or not is judged (step 33). If the secret code is correct, the operation proceeds to step 35. On the other hand, if the secret code is incorrect, an error message is displayed (step 34) and the operation returns to step 32. Then, a personal code is input (step 35) and stored (step 36). Subsequently, copy-prohibited printed matter is placed on the document platen 85 (step 37), the PRINT key is pressed (step 38), and the copy-prohibited printed matter is scanned (step 39) to process the image data (step 40).

If the copy-prohibited printed matter is particular copy-prohibited printed matter specified by a user or a manufacturer (steps 51 and 52), the image data processed in step 40 is stored in a specified area in the memory 123 (step 53). Whereas, if it is not the copy-prohibited printed matter specified by the user or manufacturer, the image data processed in step 40 is stored in an empty area in the memory 123 (step 54). If registration of the pattern of another copy-prohibited printed matter is to be successively performed (step 55), steps 37 to 40 and 51 to 55 are repeated, and then the registration is complete.

As described above, the CPU 124 distinguishes between the pattern of the specified copy-prohibited printed matter and that of the newly registered copy-prohibited printed matter. Namely, the CPU 124 or the digital copying machine updates only the pattern of the newly registered copy forbidden printed matter. In other words, the specified copy-prohibited printed matter can not be updated. Since the digital copying machine of this embodiment prohibits updating and erasing of the pattern of the specified copy-prohibited printed matter, the effect of preventing counterfeiting of copy-prohibited printed matter is enhanced.

EMBODIMENT 6

Figure 24:
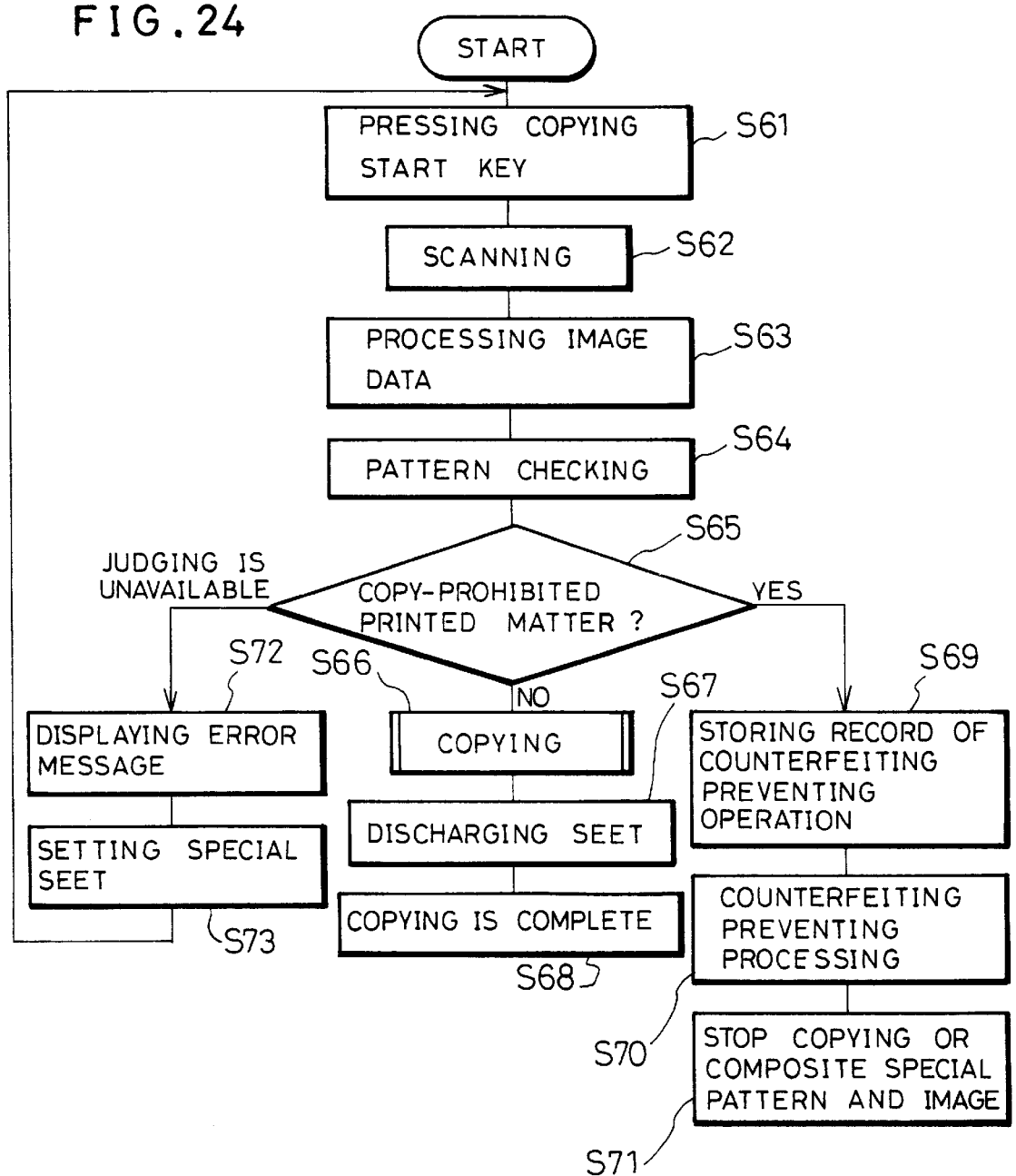
FIG. 24 is a flowchart showing a process of preventing counterfeiting of copy-prohibited printed matter to be performed by the CPU in the image processor of FIG. 23.
Figure 25:
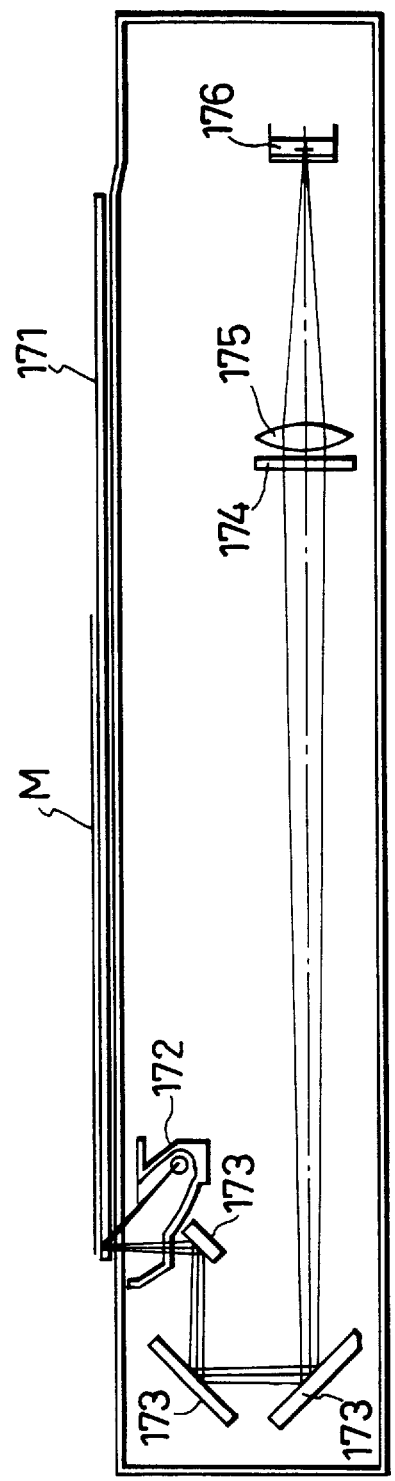
FIG. 25 is a view showing the schematic structure of a conventional image reading apparatus.
Figure 26:
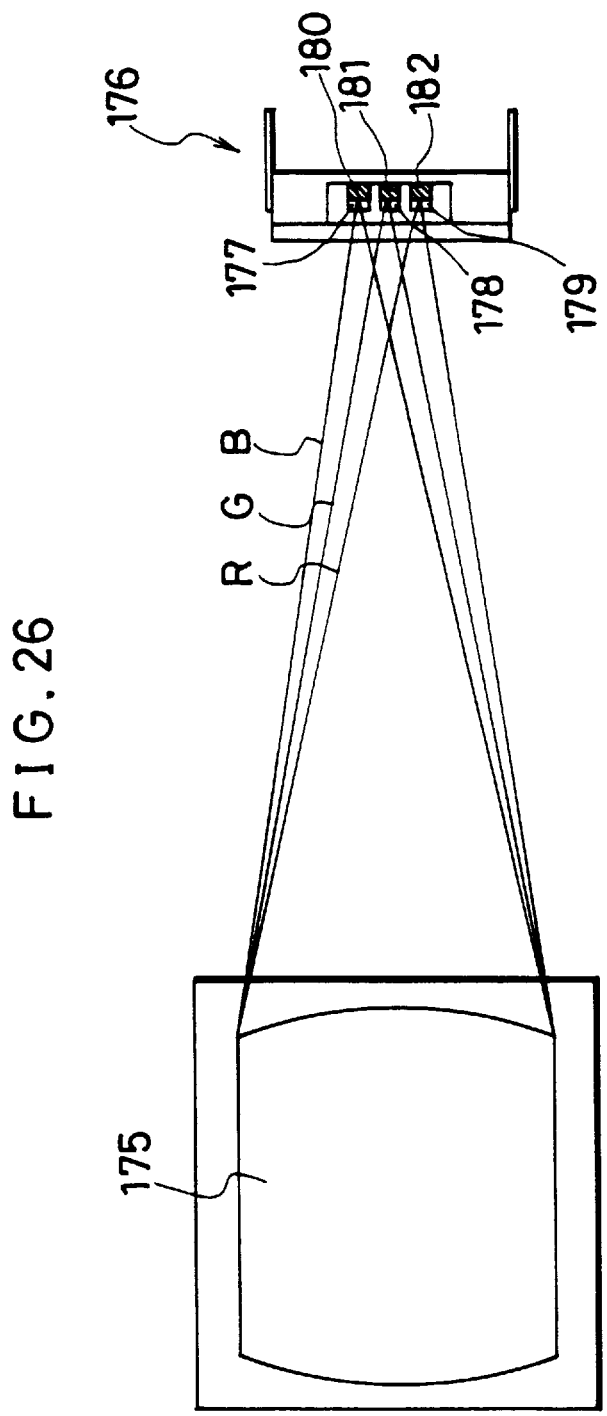
FIG. 26 is a vertical section of a reading element in a conventional image reading apparatus, exposed to visible light.
Figure 27:
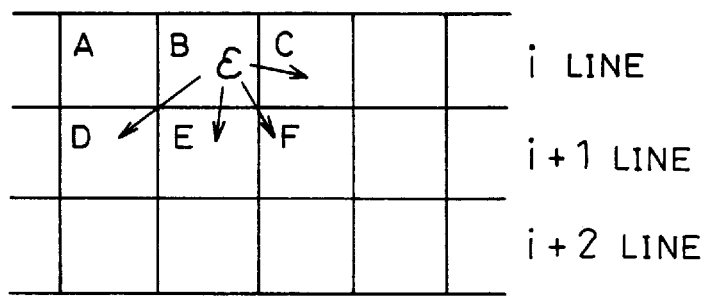
FIG. 27 is a view explaining processing performed by a CPU of the image processor incorporating a conventional image reading apparatus.
Figure 28:
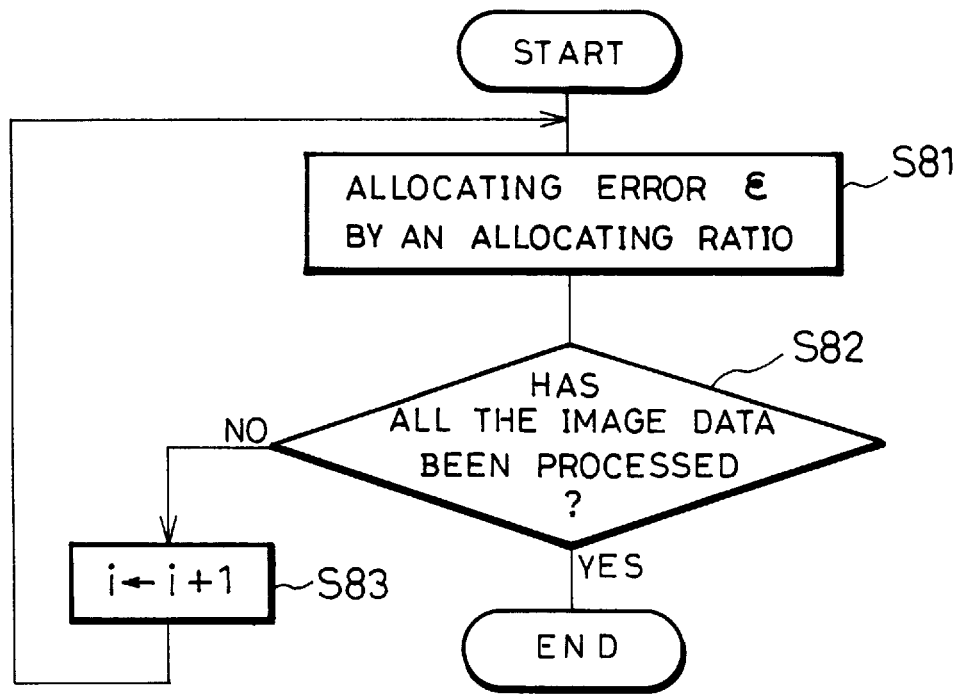
FIG. 28 is a flowchart showing the steps in the processing to be performed by the CPU in the conventional image processor.

The following description discusses still another embodiment of the present invention with reference to FIGS. 23 and 24. The members having the same function as those of the digital copying machine of EMBODIMENT 4 will be designated by the same code and their description will be omitted.

A digital copying machine as an image processor of this embodiment performs the following functions. The CPU 124 stores the record of the operations performed for preventing counterfeiting of copy-prohibited printed matter in the memory 123. As illustrated in FIG. 23, the memory 123 stores the date and time of each of counterfeiting preventing operations performed, a matched pattern, and the number of times that a pattern of copy-prohibited printed matter has matched the pattern of a document read. Except for this function, the structure of the digital copying machine of this embodiment is the same as that of the digital copying machine of EMBODIMENT 3.

The following description discusses how registration and updating of a pattern of copy-prohibited printed matter are carried out by the CPU 124 in the digital copying machine having this structure with reference to the flowchart of FIG. 24.

First, a document is placed on the document platen 85 and the copying start key is pressed (step 61). Then, the document is scanned (step 62) to process the image data (step 63). Subsequently, the pattern of the image data and the registered pattern stored in the memory 123 are compared with each other i.e. pattern checking is performed (step 64) so as to judge whether the document is copy-prohibited printed matter or not (step 65). The judgement is made according to a predetermined judgement standard.

If the document is not copy-prohibited printed matter, a series of copying operations is performed (step 66), a sheet is discharged (step 67) and copying is complete (step 68). If it is impossible to judge whether the document is copy-prohibited printed matter or not in step 65, an error message is displayed on the LCD 126 (step 72). Then, an instruction to place a special sheet over the document on the document platen 85 is given (step 73), and the operation moves to step 61.

If the document is copy-prohibited printed matter, a record of the counterfeiting preventing operation is stored in the memory 123 (step 69). Then, the counterfeiting preventing operation is executed (step 70) to stop copying or to composite a special pattern and the image of the document (step 71). Compositing the special pattern and the image of the document is carried out by superimposing a message (special pattern) such as "copy-prohibited printed matter" and "copy" on the image of the document on sheet when printing a copy of the document.

As described above, since the CPU 124 or the digital copying machine of this embodiment stores the record of counterfeiting preventing operations performed, it is easy to manage counterfeiting operations.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image processor comprising:
   an image reading apparatus including
     first photoelectric converting means for receiving visible light in reflected light from a color document and reading a first image pattern, corresponding to the visible light, as electrical signals, and second photoelectric converting means for receiving infrared light in the reflected light from the color document and reading a second image pattern, corresponding to the infrared light, as electrical signals;

storage means for storing distinguished feature portions of copy-prohibited printed matter;

recognizing means for distinguishing an edge section and a feature portion of the color document from the image patterns read by said image reading apparatus;

comparing means for comparing the feature portion of the image patterns with the distinguished feature portions of copy-prohibited printed matter, and for judging the color document is copy-prohibited printed matter if the feature portion of the image patterns resemble the distinguished feature portions of copy-prohibited printed matter; and a RAM for storing a record of operations performed, for preventing counterfeiting of copy-prohibited printed matter.

2. The image processor according to claim 1, further comprising input means for inputting a secret code for preventing counterfeiting of said copy-prohibited printed matter.

3. The image processor according to claim 1, further comprising input means for inputting a secret code for preventing counterfeiting of said copy-forbidden printed matter and a personal code for identifying a user.

4. The image processor according to claim 1, wherein said storage means includes a RAM capable of updating the stored feature portion.

5. The image processor according to claim 1, wherein said storage means includes a RAM capable of erasing the stored feature portion.

6. The image processor according to claim 1, wherein said storage means includes a RAM capable of updating the stored feature portion of copy-prohibited printed matter other than a specified copy-prohibited printed matter.

7. The image processor according to claim 1, wherein said storage means includes a RAM capable of erasing the stored feature portion of copy-prohibited printed matter other than particularly specified copy-prohibited printed matter.

8. The image processor according to claim 1, wherein said recognizing means instructs the storage means for store and/or erase the feature portion only when a registered secret code is input.

9. The image processor according to claim 1, wherein said recognizing means instructs the storage means to store and/or erase the feature portion only when a registered personal code is input.

10. An image processor comprising:

an image reading apparatus including
first photoelectric converting means for receiving visible light in reflected light from a color document and reading a first image pattern, corresponding to the visible light, as electrical signals, and second photoelectric converting means for receiving infrared light in the reflected light from the color document and reading a second image pattern, corresponding to the infrared light, as electrical signals;

comparing means for comparing the first image pattern and the second image pattern with stored registered patterns of copy-prohibited printed matter, and for judging the color document is copy-prohibited Printed matter if the first image pattern and second image pattern resemble the stored registered patterns.

11. An image processor capable of determining if a color document is copy-prohibited comprising:

a first photoelectric converter for receiving visible light in reflected light from a color document and reading a first image pattern corresponding to the visible light;

a second photoelectric converter for receiving infrared light in the reflected light from the color document and reading a second image pattern corresponding to the inferred light;

stored registered patterns of copy-prohibited printed matter; and a comparator for comparing features of the first image pattern and the second image pattern with the stored registered patterns of copy-prohibited printed matter, and determining that the color document is copy-prohibited printed matter if features of the first image pattern and second image pattern resemble the stored registered patterns.

* * * * *